(12) United States Patent
Nakamura et al.

(10) Patent No.: US 10,468,597 B2
(45) Date of Patent: Nov. 5, 2019

(54) METHOD OF MANUFACTURING ORGANIC SEMICONDUCTOR FILM

(71) Applicants: FUJIFILM Corporation, Tokyo (JP); THE UNIVERSITY OF TOKYO, Tokyo (JP)

(72) Inventors: Seigo Nakamura, Kanagawa (JP); Yoshiki Maehara, Kanagawa (JP); Yuichiro Itai, Kanagawa (JP); Yoshihisa Usami, Kanagawa (JP); Junichi Takeya, Tokyo (JP)

(73) Assignees: FUJIFILM Corporation, Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 16/041,766

(22) Filed: Jul. 21, 2018

(65) Prior Publication Data
US 2018/0331289 A1 Nov. 15, 2018

Related U.S. Application Data

(63) Continuation of application No. PCT/JP2017/000589, filed on Jan. 11, 2017.

(30) Foreign Application Priority Data

Feb. 3, 2016 (JP) ................. 2016-019101

(51) Int. Cl.
*H01L 51/00* (2006.01)
*H01L 29/786* (2006.01)
(Continued)

(52) U.S. Cl.
CPC ........ *H01L 51/0003* (2013.01); *H01L 29/786* (2013.01); *H01L 51/05* (2013.01);
(Continued)

(58) Field of Classification Search
None
See application file for complete search history.

(56) References Cited

U.S. PATENT DOCUMENTS

| 2003/0175430 A1* | 9/2003 | Tomaru | B05C 5/0254 427/356 |
| 2006/0207457 A1* | 9/2006 | Rogojevic | H01L 51/0004 101/454 |

(Continued)

FOREIGN PATENT DOCUMENTS

| JP | H09-092617 A | 4/1997 |
| JP | 2013-077799 A | 4/2013 |

(Continued)

OTHER PUBLICATIONS

International Search Report issued in PCT/JP2017/000589; dated Mar. 21, 2017.

(Continued)

*Primary Examiner* — Evren Seven
(74) *Attorney, Agent, or Firm* — Studebaker & Brackett PC

(57) ABSTRACT

A method of manufacturing an organic semiconductor film, including a step of moving a coating blade surface positioned to face a substrate surface in a first direction parallel to the substrate surface, while in contact with an organic semiconductor solution supplied to a portion between the blade surface and the substrate surface to form the organic semiconductor film in the first direction. The coating blade is disposed to have first and second gaps having different separation gap sizes with the substrate surface in a region where the blade surface and the organic semiconductor solution are in contact. The first gap is positioned on an upstream side of the first direction and the second gap, which is smaller than the first gap, is provided on a downstream side. A second gap size is a minimum distance between the substrate surface and the blade surface and is 40 μm or less.

18 Claims, 10 Drawing Sheets

(51) Int. Cl.
  *H01L 51/05* (2006.01)
  *H01L 51/10* (2006.01)
  *B05C 11/04* (2006.01)
(52) U.S. Cl.
  CPC ........ *H01L 51/0512* (2013.01); *H01L 51/105* (2013.01); *B05C 11/045* (2013.01)

(56) References Cited

U.S. PATENT DOCUMENTS

| | | | |
|---|---|---|---|
| 2007/0243658 A1* | 10/2007 | Hirai | H01L 51/0004 438/99 |
| 2011/0159171 A1 | 6/2011 | Hsu et al. | |
| 2012/0193618 A1* | 8/2012 | Takeya | H01L 51/0004 257/40 |
| 2014/0093997 A1* | 4/2014 | Chung | H01L 51/0014 438/99 |
| 2015/0060800 A1* | 3/2015 | Qiu | B05C 1/00 257/40 |
| 2016/0104842 A1* | 4/2016 | Takeya | H01L 51/0003 |
| 2016/0260900 A1* | 9/2016 | Patel | H01L 51/0012 |
| 2017/0098800 A1* | 4/2017 | Kim | B41N 1/24 |
| 2018/0326447 A1* | 11/2018 | Nakamura | H01L 51/05 |
| 2018/0366590 A1* | 12/2018 | Nakamura | H01L 51/0003 |

FOREIGN PATENT DOCUMENTS

| | | |
|---|---|---|
| JP | 2014-216568 A | 11/2014 |
| WO | 2007/125950 A1 | 11/2007 |
| WO | 2011/040155 A1 | 4/2011 |
| WO | 2014/175351 A1 | 10/2014 |

OTHER PUBLICATIONS

Written Opinion issued in PCT/JP2017/000589; dated Mar. 21, 2017.
"Tuning charge transport in solution-sheared organic semiconductors using lattice strain"; Nature; Dec. 2011; pp. 504-508; vol. 480; Macmillan Publishers Limited.
An Office Action; "Notification of Reasons for Refusal," Mailed by the Japanese Patent Office dated Jan. 8, 2019, which corresponds to Japanese Patent Application No. 2017-565443 and is related to U.S. Appl. No. 16/041,766; with English language translation.
Hongseok Youn et al., "All-solution blade-slit coated polymer light-emitting diodes", Organic Electronics, Elsevier, Amsterdam, NL, vol. 13, No. 8, Apr. 19, 2012, pp. 1470-1478.
Extended European Search Report issued by the European Patent Office dated Jan. 17, 2019, which corresponds to EP17747153.9-1211 and is related to U.S. Appl. No. 16/041,766.
An Office Action mailed by the Japanese Patent Office dated Jul. 2, 2019, which corresponds to Japanese Patent Application No. 2017-565443 and is related to U.S. Appl. No. 16/041,766; with English translation.

* cited by examiner

METHOD OF MANUFACTURING ORGANIC SEMICONDUCTOR FILM

CROSS-REFERENCE TO RELATED APPLICATIONS

This application is a Continuation of PCT International Application No. PCT/JP2017/000589 filed on Jan. 11, 2017, which claims priority under 35 U.S.C. § 119(a) to Japanese Patent Application No. 2016-019101 filed on Feb. 3, 2016. The above application is hereby expressly incorporated by reference, in its entirety, into the present application.

BACKGROUND OF THE INVENTION

1. Field of the Invention

The present invention relates to a method of manufacturing an organic semiconductor film by a coating method and particularly relates to a method of manufacturing a high quality organic semiconductor film having high crystallinity and high mobility with high productivity.

2. Description of the Related Art

At present, an organic semiconductor is expected as a semiconductor material used for a flexible device and the like. The organic semiconductor may be formed by low-temperature coating compared with an inorganic semiconductor such as silicon. Various methods of manufacturing an organic semiconductor film using an organic semiconductor are suggested.

In the method of manufacturing an organic semiconductor thin film of WO2014/175351A, a raw material solution obtained by dissolving an organic semiconductor material in a solvent is supplied to a substrate, and the solvent is evaporated so as to precipitate crystals of the organic semiconductor material, such that an organic semiconductor thin film is formed on the substrate. A cross section-forming member having a contact surface on one side thereof is used, and the cross section-forming member is disposed so as to face the surface of the substrate so that the contact surface thereof intersect with the surface of the substrate at a fixed angle, a liquid droplet of a raw material solution that is in contact with the contact surface is formed by supplying the raw material solution on the substrate, the substrate and the cross section-forming member are relatively moved in a direction parallel to the surface of the substrate and in a direction in which the cross section-forming member is spaced from the liquid droplet, and the solvent in the liquid droplet is evaporated while the raw material solution is supplied such that the fluctuation in the sizes of the liquid droplets accompanied by the relative movement is maintained in a predetermined range, such that an organic semiconductor thin film is formed on the substrate after the contact surface is moved.

In the method of manufacturing the organic semiconductor thin film of WO2011/040155A, an organic semiconductor film is formed on a substrate, by supplying a raw material solution including an organic semiconductor material and a solvent on a substrate and drying the raw material solution. A contact member in which a plurality of contact surfaces to which raw material solutions are respectively attached are disposed is used. The contact member is disposed such that the contact surface and the surface of the substrate have a certain relationship, and a plurality of liquid droplets of the raw material solution are formed on the substrate, so as to form a liquid droplet holding state in which these liquid droplets are held on the plurality of contact surfaces. An organic semiconductor film is formed at respective positions of the surfaces of the substrate corresponding to the plurality of contact surfaces by evaporating the solvent in the liquid droplet.

In "Tuning charge transport in solution-sheared organic semiconductors using lattice strain, Nature, 480 (2011) 504", the only surface before evaporation is exposed, and the shear plate draws the solution throughout the heated substrate during a solution shear process while most of the solution is maintained between the plate and the substrate, so as to form an organic semiconductor film.

In JP2013-77799A, from a location at which the application of ink including an organic semiconductor material starts, the ink is dried, and the organic semiconductor material in the ink is crystallized, so as to form an organic semiconductor thin film. At this point, a nozzle portion including a nozzle body portion having an overhang portion forming a tip end face opposed to the surface of the substrate and a solution jetting portion having a jetting port that protrudes from the tip end face of the nozzle body portion toward the substrate side and extends in one direction as a longitudinal direction is used. The ink is jetted in a state in which the lower end of the solution jetting portion is spaced from the substrate, and the nozzle portion is moved in a direction perpendicular to the longitudinal direction of the jetting port while a liquid reservoir is formed with the jetted ink between the solution jetting portion and the substrate, so as to apply the ink in a line shape.

SUMMARY OF THE INVENTION

WO2014/175351A discloses a manufacturing method for continuously forming an organic semiconductor by coating, but the organic semiconductor film may be cut during the manufacturing, such that continuous forming may not be performed and the film quality of the organic semiconductor film may be deteriorated.

WO2011/040155A discloses that an organic semiconductor film is formed at the respective positions of the surfaces of the substrate, and the organic semiconductor film is not continuously formed.

In "Tuning charge transport in solution-sheared organic semiconductors using lattice strain, Nature, 480 (2011) 504", the distance between the substrate and the shear plate is as wide as 100 μm, satisfactory film quality may not be obtained, and a thin film transistor having satisfactory characteristics may not be obtained.

In JP2013-77799A, a moving speed at which a nozzle portion is moved in a direction perpendicular to the longitudinal direction of the jetting port is 30 μm/sec or slower, that is, 1.8 mm/min or slower, and thus an organic semiconductor film may not be formed at a high speed.

An object of the present invention is to solve the problems based on the related art described above and to provide a method of manufacturing an organic semiconductor film in which a high quality organic semiconductor film having high crystallinity and high mobility can be manufactured with high productivity.

In order to achieve the above object, the present invention provides a method of manufacturing an organic semiconductor film, comprising: a manufacturing step of moving a blade surface of a coating blade disposed to be spaced so as to face a substrate surface of a substrate in a first direction parallel to the substrate surface in a manner of being in contact with an organic semiconductor solution, while supplying the organic semiconductor solution to a portion between the blade surface and the substrate surface, so as to form an organic semiconductor film in the first direction, in which the coating blade is disposed so as to have a first gap and a second gap having different separation gap sizes with respect to the substrate surface in a region in which the blade surface and the organic semiconductor solution are in contact with each other, such that the first gap is provided on an upstream side of the first direction and a second gap having a smaller gap size compared with the first gap is provided on a downstream side, and in which a size of the second gap is a minimum distance between the substrate surface and the blade surface and is 40 μm or less.

For example, the second gap is in an end portion on the first direction side of the region in which the blade surface and the organic semiconductor solution are in contact with each other.

It is preferable that a size of the first gap is 0.5 mm to 5 mm.

For example, the first gap is in an end portion on an opposite side to the first direction of the region in which the blade surface and the organic semiconductor solution are in contact with each other.

It is preferable that the blade surface has a tilted surface that is tilted with respect to the substrate surface by 1° to 14°.

It is preferable that the blade surface has a tilted surface that is tilted with respect to the substrate surface and a planar surface parallel to the substrate surface, the tilted surface is provided on the first gap side, and the plane is provided on the second gap side. It is preferable that the blade surface has a tilted surface that is monotonically tilted with respect to the substrate surface.

It is preferable that the blade surface has a level difference portion to the substrate surface.

It is preferable that a supply port for supplying the organic semiconductor solution is disposed in two subdivisions in the center among subdivisions obtained by dividing a length in the first direction formed by projecting the region in which the blade surface and the organic semiconductor solution are in contact with each other to the substrate surface into four at an equal interval.

It is preferable that, in a case where a boiling point of a solvent of the organic semiconductor solution is set to Tb° C. and a temperature of the substrate surface is set to Ts° C., in the manufacturing step, the temperature Ts is maintained at a temperature satisfying Tb−30° C.≤Ts≤Tb. It is preferable that, in a case where a boiling point of a solvent of the organic semiconductor solution is set to Tb° C. and a temperature of the substrate surface is set to Ts° C., in the manufacturing step, the temperature Ts is maintained at a temperature satisfying Tb−20° C.≤Ts≤Tb.

In the manufacturing step, it is preferable that a moving speed of the blade surface is 5 mm/min or faster.

In the manufacturing step, it is preferable that a moving speed of the blade surface is 10 mm/min or faster.

It is preferable that the blade surface has at least one protrusion that faces the substrate surface, and in the manufacturing step, the protrusion is in contact with the substrate surface, and the blade surface is moved in the first direction.

It is preferable that at least one protrusion that faces the blade surface is provided on the substrate surface, and in the manufacturing step, the protrusion is in contact with the blade surface, and the blade surface is moved in the first direction.

In the manufacturing step, it is preferable that a distance between the blade surface and the substrate surface is measured by an optical measuring method, sizes of the first gap and the second gap are maintained, and the blade surface is moved in the first direction.

It is preferable that a cover portion that covers at least a crystal growth portion of the organic semiconductor solution between the blade surface and the substrate surface is provided.

According to the present invention, a high quality organic semiconductor film having high crystallinity and high mobility can be manufactured with high productivity.

DESCRIPTION OF THE PREFERRED EMBODIMENTS

Hereinafter, based on the preferable embodiment illustrated in the accompanying drawings, a method of manufacturing an organic semiconductor film according to the present invention is specifically described.

The expression "to" indicating in the numerical range described below include numerical values described on both sides. For example, the expression "ε is a numerical value α to a numerical value β" means that the range of E is a range including the numerical value α and the numerical value β, and is α≤ε≤β, in a case of being indicated by mathematical symbols.

An angle such as "parallel", "perpendicular", and "orthogonal" includes an error range that is generally acceptable in the technical field with respect to an exact angle.

Figure 1:
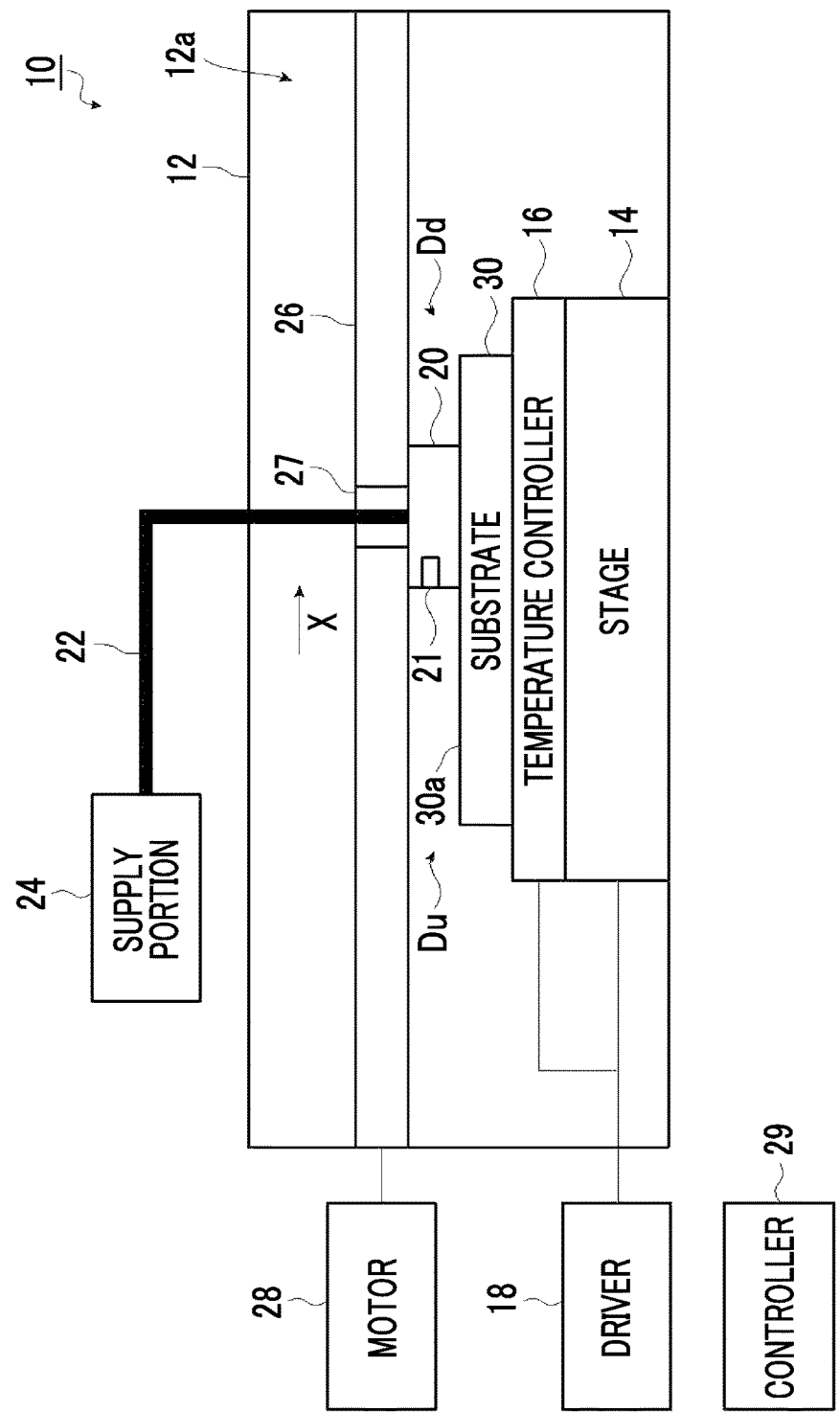
FIG. 1 is a schematic view illustrating an example of a manufacturing device used in a method of manufacturing an organic semiconductor film according to an embodiment of the present invention.

FIG. 1 is a schematic view illustrating an example of a manufacturing device used in a method of manufacturing an organic semiconductor film according to an embodiment of the present invention.

A manufacturing device 10 illustrated in FIG. 1 is used in the method of manufacturing the organic semiconductor film according to the embodiment of the present invention.

In the manufacturing device 10, a stage 14, a temperature controller 16 disposed on the stage 14, a coating head 20, and a guide rail 26 that moves the coating head 20 in a first direction X and a direction opposite to the first direction X are provided in an inside portion 12a of a casing 12.

The stage 14 and the temperature controller 16 are connected to a driver 18, and the movement of a substrate 30 described below by the stage 14 and the temperature of the substrate 30 described below by the temperature controller 16 are controlled by the driver 18. The coating head 20 is connected to a supply portion 24 via a supply pipe 22.

The guide rail 26 is connected to a motor 28, and the coating head 20 is moved in the first direction X and the direction opposite to the first direction X by the motor 28.

The driver 18, the supply portion 24, and the motor 28 are connected to a controller 29, and the driver 18, the supply portion 24, and the motor 28 are controlled by the controller 29.

The first direction X and the direction opposite to the first direction X are directions parallel to the surface of the stage 14. Since the substrate 30 is disposed on the stage 14 such that a substrate surface 30a of the substrate 30 and the surface of the stage 14 are parallel to each other, the direction parallel to the substrate surface 30a of the substrate 30 is also the first direction X.

On the stage 14, the temperature controller 16 is disposed, and the substrate 30 is further disposed, such that the substrate 30 may be moved in the first direction X and a direction opposite to the first direction X and is moved in a second direction Y (not illustrated) orthogonal to the first direction X in the same plane. The stage 14 moves the substrate 30 in a direction opposite to the second direction Y.

The configuration of the stage 14 is not particularly limited, as long as the substrate 30 is moved in the first direction X, a direction opposite thereto, the second direction Y, and a direction opposite thereto.

The temperature controller 16 sets the temperature of the substrate 30 to a predetermined temperature and maintains the temperature. The configuration of the temperature controller 16 is not particularly limited, as long as the temperature of the substrate 30 is set as the predetermined temperature. For example, a hot plate may be used for the temperature controller 16.

The coating head 20 forms an organic semiconductor film on the substrate surface 30a of the substrate 30, an organic semiconductor solution (not illustrated) for forming an organic semiconductor film is supplied from the supply portion 24. The configuration of the coating head 20 is described below in detail.

The substrate 30 corresponds to a single body of the substrate 30, and as well as, in a case where a layer is formed on the substrate surface 30a of the substrate 30, and in a case where the organic semiconductor film is formed on the surface of the layer, the surface of the layer corresponds to the substrate surface 30a of the substrate 30.

The configuration of the supply pipe 22 connected to the coating head 20 is not particularly limited, as long as the organic semiconductor solution may be supplied from the supply portion 24 to a portion between a blade surface 32a (see FIG. 2) of a coating blade 32 (see FIG. 2) of the coating head 20 and the substrate surface 30a of the substrate 30. It is preferable that the supply pipe 22 has flexibility so as to follow the coating head 20 in a case where the coating head 20 moves. The number of the supply pipe 22 is not limited to one, but may be plural, and may be appropriately determined according to the size of the coating blade 32 of the coating head 20 and the size of the organic semiconductor film.

The supply portion 24 supplies the organic semiconductor solution to a portion between the blade surface 32a (see FIG. 2) of the coating blade 32 (see FIG. 2) of the coating head 20 and the substrate surface 30a of the substrate 30, and, for example, includes a tank (not illustrated) that stores an organic semiconductor solution, a pump (not illustrated) that delivers the organic semiconductor solution in the tank to the coating head 20, and a flow meter (not illustrated) that measures a delivery amount of the organic semiconductor solution. As the supply portion 24, for example, a syringe pump may be used.

It is preferable that the temperatures of the supply portion 24 and the supply pipe 22 are timely controlled by heating. It is preferable that the temperatures of the supply portion 24 and the supply pipe 22 are set to a temperature approximately equal to the substrate temperature. An organic semiconductor solution 36 is completely dissolved by heating, such that the organic semiconductor solution 36 may be stably supplied. As the temperature difference of the organic semiconductor solution 36 and the substrate 30 is smaller during the supply, a stable liquid reservoir 34 may be formed.

A sensor 21 that measures a distance between the substrate surface 30a of the substrate 30 disposed on the temperature controller 16 and the blade surface 32a (see FIG. 2) of the coating blade 32 (see FIG. 2) of the coating head 20 is provided in the coating head 20. This sensor 21 is connected to the controller 29, and based on the distance between the substrate surface 30a of the substrate 30 and the blade surface 32a (see FIG. 2) of the coating blade 32 (see FIG. 2), the driver 18, the supply portion 24, and the motor 28 are controlled by the controller 29. The configuration of the sensor 21 is not particularly limited, as long as the distance may be measured, and the distance is measured, for example, by an optical measuring method. For the sensor 21, a sensor using interference of light, a sensor using a common focus, and a sensor using laser light may be appropriately used.

The guide rail 26 moves the coating head 20 in the first direction X and the direction opposite thereto. The coating head 20 is attached to the guide rail 26 by a carriage 27.

The carriage 27 may be moved in the first direction X and the direction opposite thereto by the guide rail 26, and the coating head 20 is moved in the first direction X and the direction opposite thereto, together with the carriage 27. The carriage 27 is moved in the first direction X and the direction opposite thereto by the motor 28.

The position of the carriage 27 may be calculated from a reading value of a linear scale (not illustrated) provided on the guide rail 26, and the position in the first direction X of the coating head 20 may be calculated. The carriage 27 may change the attachment height and the attachment angle of the coating head 20. The moving speed of the coating head 20, that is, the moving speed of the blade surface 32a (see FIG. 2) of the coating blade 32 (see FIG. 2) is adjusted by the motor 28.

In the manufacturing device 10, the coating head 20 may be moved in the first direction X and the direction opposite thereof, and the substrate 30 may be moved in the first direction X and the direction opposite thereof. Hereinafter, the first direction X is referred to as an X direction. The second direction Y is referred to as a Y direction.

The coating head 20 is specifically described below.

Figure 2:
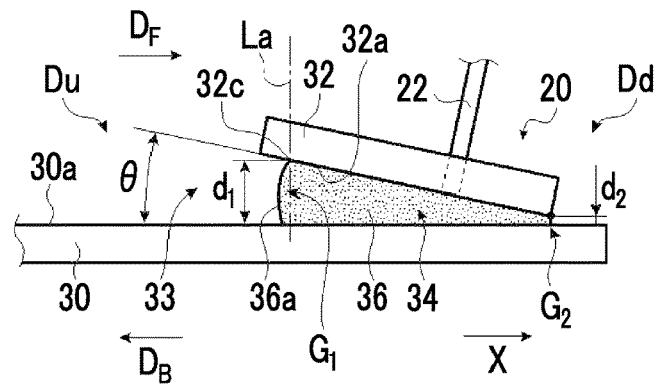
FIG. 2 is a schematic view illustrating a coating head of the manufacturing device used in the method of manufacturing the organic semiconductor film according to the embodiment of the present invention.
Figure 3:
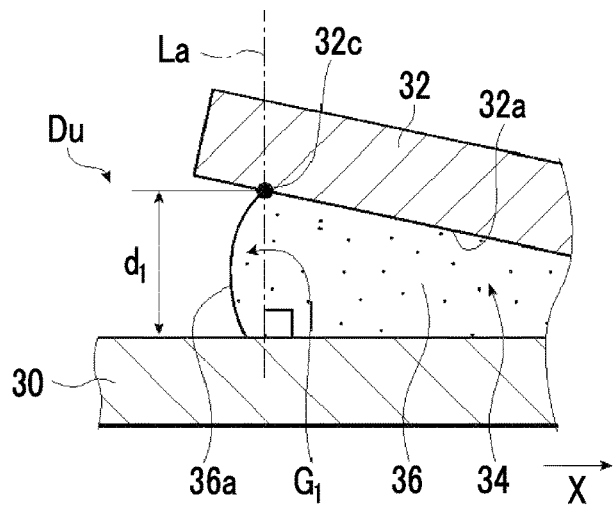
FIG. 3 is an enlarged view of a main part of one end portion of the coating head.
Figure 4:
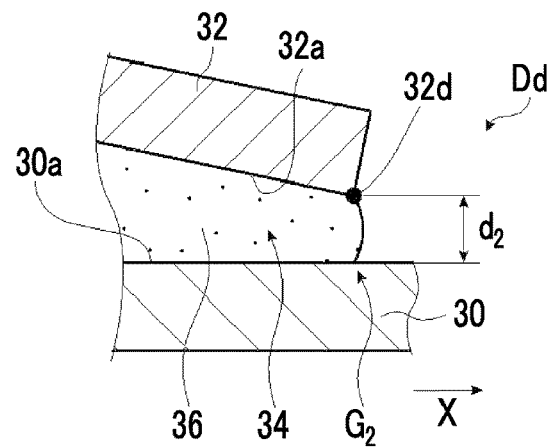
FIG. 4 is an enlarged view of a main part of the other end portion of the coating head.

FIG. 2 is a schematic view illustrating the coating head of the manufacturing device used in the method of manufacturing the organic semiconductor film according to the embodiment of the present invention, FIG. 3 is an enlarged view of a main part of one end portion of the coating head, and FIG. 4 is an enlarged view of a main part of the other end portion of the coating head.

The coating head 20 has the coating blade 32 formed of a flat plate as shown in FIG. 2. An organic semiconductor film 38 (see FIG. 8) is formed by the coating blade 32. The coating blade 32 is tilted with respect to the substrate surface 30a of the substrate 30 and is disposed to be spaced so as to face the substrate surface 30a of the substrate 30. The blade surface 32a of the coating blade 32 is a tilted surface that is monotonically tilted with respect to the substrate surface 30a of the substrate 30. The blade surface 32a of the coating blade 32 may not be a tilted surface that is monotonically tilted.

A tilt angle θ of the blade surface 32a of the coating blade 32 with respect to the substrate surface 30a of the substrate 30 is an angle formed by the substrate surface 30a of the substrate 30 and the blade surface 32a of the coating blade 32. The length of the coating blade 32 is about 2 cm.

In the coating head 20, the organic semiconductor solution 36 is supplied from the supply portion 24 via the supply pipe 22, the liquid reservoir 34 of the organic semiconductor solution 36 is formed between the substrate surface 30a of the substrate 30 and the blade surface 32a of the coating blade 32. In this manner, the blade surface 32a of the coating blade 32 comes into contact with the organic semiconductor solution 36, and the liquid reservoir 34 is a region in which the blade surface 32a of the coating blade 32 is in contact with the organic semiconductor solution 36.

The blade surface 32a of the coating blade 32 of the coating head 20 has a first gap $G_1$ and a second gap $G_2$ in which the sizes of the separation gaps are different, in the X direction to the liquid reservoir 34 between the blade surface 32a and the substrate surface 30a of the substrate 30. The coating blade 32 is disposed in a region in which the blade surface 32a and the organic semiconductor solution 36 are in contact with each other, to have the first gap $G_1$ on an upstream side Du in the X direction and the second gap $G_2$ in which the size of the gap is smaller than the first gap $G_1$, on a downstream side Dd.

The first gap $G_1$ is clearance with one end portion of the liquid reservoir 34 in the X direction. In the coating head 20 illustrated in FIG. 2, the first gap $G_1$ is in the end portion on the side opposite to the X direction of the liquid reservoir 34 of the coating blade 32, that is, the upstream side Du in the X direction. In the coating head 20 illustrated in FIG. 2, the second gap $G_2$ is clearance with the substrate surface 30a of the substrate 30 of the other end portion of the liquid reservoir 34 in the X direction. The second gap $G_2$ is, for example, in the end portion of the X direction of the liquid reservoir 34, that is, the downstream side Dd in the X direction. The blade surface 32a of the coating blade 32 and the substrate surface 30a of the substrate 30 are open on the first gap $G_1$ side, to form an open portion 33. In a case where a film is manufactured by forming the liquid reservoir 34 in this form, it is possible to suppress the generation of the vibration of the organic semiconductor solution 36 in the liquid reservoir 34 so as to improve the film quality of the organic semiconductor film 38. Therefore, in a case where the thin film transistor is manufactured, satisfactory characteristics may be obtained. In contrast, in a case where the first gap is set to an end portion in the X direction of the liquid reservoir 34 and the second gap is set to an end portion on the opposite side thereof, the amount of liquid in the crystal growth portion is small, and it is difficult for the crystal growth to occur, such that defects may be generated in the organic semiconductor film.

The coating head 20, that is, the blade surface 32a of the coating blade 32 is moved in a $D_F$ direction in a case where the organic semiconductor film 38 is formed. In a case where the organic semiconductor film 38 is formed, the substrate surface 30a of the substrate 30 may be moved in a $D_B$ direction.

As illustrated in FIG. 3, a size $d_1$ of the first gap $G_1$ is a length between the location 32c and the substrate surface 30a of the substrate 30 in a straight line La perpendicular to the substrate surface 30a of the substrate 30 through a location 32c in which a liquid surface 36a of the organic semiconductor solution 36 in the open portion 33 of the liquid reservoir 34 is in contact with the blade surface 32a of the coating blade 32.

A size $d_2$ of the second gap $G_2$ is a minimum distance between the substrate surface 30a of the substrate 30 and the blade surface 32a of the coating blade 32 of the coating head 20 in the liquid reservoir 34 and is 40 μm or less. In the coating blade 32, as described above, the blade surface 32a is monotonically tilted with respect to the substrate surface 30a of the substrate 30. In this case, a length between the substrate surface 30a of the substrate 30 and a corner portion 32d of the coating blade 32 illustrated in FIG. 4 becomes a minimum distance. Therefore, in the coating head 20 illustrated in FIG. 2, the size $d_2$ of the second gap $G_2$ is a length between the substrate surface 30a of the substrate 30 and the corner portion 32d of the coating blade 32.

The size $d_1$ of the first gap $G_1$ is preferably 0.5 mm to 5 mm. The size $d_1$ is more preferably 0.5 mm to 1.6 mm.

In a case where the size $d_1$ of the first gap $G_1$ is 0.5 mm to 5 mm, the organic semiconductor solution 36 sufficient for forming the organic semiconductor film 38 may be secured in the liquid reservoir 34.

With respect to the size $d_1$ of the first gap $G_1$ and the size $d_2$ of the second gap $G_2$, the size $d_2$ of the second gap $G_2$ is measured in an amount of raising the carriage 27 from a state of bringing the blade surface 32a of the coating blade 32 to come into contact with the substrate surface 30a of the substrate 30. In a case where a micrometer (not illustrated) for height adjustment is provided in the carriage 27, the size $d_2$ of the second gap $G_2$ may be measured. In a case where the tilt angle θ of the coating blade 32 is known, the size $d_1$ of the first gap $G_1$ may be also calculated from the length of the coating blade 32.

Specifically, the size $d_1$ of the first gap $G_1$ obtains a digital image including the substrate 30 from the side surface of the coating blade 32, this digital image is stored in a computer, the straight line La is drawn on the digital image based on the digital image, and the length between the location 32c of the blade surface 32a and the substrate surface 30a of the substrate 30 is measured on the computer.

The size $d_2$ of the second gap $G_2$ obtains a digital image including the substrate 30 from the side surface of the coating blade 32, this digital image is stored in the computer, and a length between the substrate surface 30a of the substrate 30 and the corner portion 32d of the blade surface 32a of the coating blade 32 is measured on the computer, based on the digital image.

For example, the tilt angle θ of the coating blade 32 is preferably 1° to 14°. The tilt angle θ is more preferably 1° to 9° and even more preferably 4° to 9°.

In a case where the tilt angle θ is 1° to 14°, the organic semiconductor solution 36 in an appropriate amount may be held, and a crystal film having high mobility may be manufactured at a fast moving speed. The tilt angle θ is not determined thereto, since in a case where the first gap $G_1$ and the second gap $G_2$ are controlled in the above range, the tilt angle θ is determined according to the relationship with the length of the coating blade 32.

The tilt angle θ may be measured with a micrometer (not illustrated) for angle adjustment provided in the carriage 27. More specifically, a digital image including the substrate 30 is obtained from the side surface of the coating blade 32, this digital image is stored in a computer, and an angle formed by the substrate surface 30a of the substrate 30 and the blade surface 32a of the coating blade 32 is created on the digital image based on the digital image, so as to obtain the angle on the computer. In a case where the blade surface 32a of the coating blade 32 is not clear, a center line of the thickness of the coating blade 32 is used.

The size $d_2$ of the second gap $G_2$ is 40 μm or less. For example, the lower limit of the size $d_2$ of the second gap $G_2$ is 10 μm.

In a case where the size $d_2$ of the second gap $G_2$ is 40 μm or less, the generation of the vibration of the organic semiconductor solution 36 in the liquid reservoir 34 may be suppressed, the film quality of the organic semiconductor film 38 may be improved. Therefore, in a case where the thin film transistor is manufactured, satisfactory characteristics may be obtained.

Meanwhile, the size $d_2$ of the second gap $G_2$ is larger than 40 μm, the organic semiconductor solution 36 in the liquid reservoir 34 vibrates, so as to deteriorate the film quality of the organic semiconductor film 38. Therefore, in a case where the thin film transistor is manufactured, satisfactory characteristics may not be obtained.

In the coating head 20, the coating blade 32 has the first gap $G_1$ and the second gap $G_2$ and is disposed on the substrate surface 30a of the substrate 30, the liquid reservoir 34 is present only between the blade surface 32a of the coating blade 32 and the substrate surface 30a of the substrate 30, the organic semiconductor solution 36 does not reach the side surface of the coating blade 32 and the organic semiconductor solution 36 is not in contact with the side surface of the coating blade 32.

As in a case where the organic semiconductor solution 36 is in contact with the side surface of the coating blade 32, the organic semiconductor solution 36 protruding from the blade surface 32a of the coating blade 32 is not restricted by the coating blade 32, and thus it is difficult to suppress the vibration. However, the liquid reservoir 34 exists between the blade surface 32a of the coating blade 32 and the substrate surface 30a of the substrate 30, the organic semiconductor solution 36 is caused to be present only in the liquid reservoir 34, so as to suppress the vibration of the organic semiconductor solution 36, that is, the vibration of the liquid reservoir 34.

Figure 5:
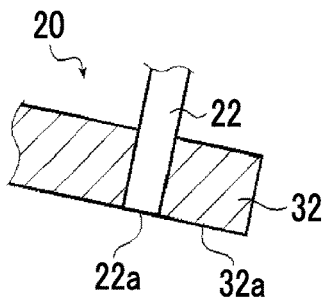
FIG. 5 is a schematic cross-sectional view illustrating a first example of a disposition position of a supply port of a supply pipe in the coating head used in the method of manufacturing the organic semiconductor film according to the embodiment of the present invention.
Figure 6:
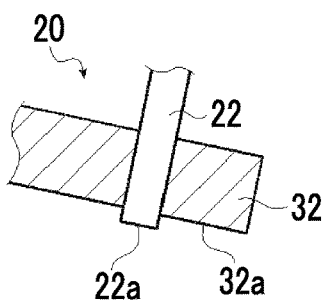
FIG. 6 is a schematic cross-sectional view illustrating a second example of a disposition position of the supply port of the supply pipe in the coating head.
Figure 7:
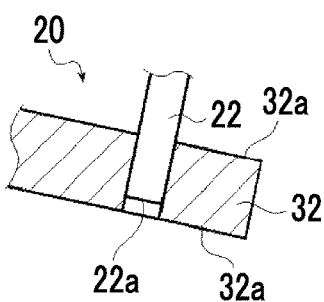
FIG. 7 is a schematic cross-sectional view illustrating a third example of a disposition position of the supply port of the supply pipe in the coating head.

FIG. 5 is a schematic cross-sectional view illustrating a first example of a disposition position of a supply port of a supply pipe in the coating head used in the method of manufacturing the organic semiconductor film according to the embodiment of the present invention, FIG. 6 is a schematic cross-sectional view illustrating a second example of a disposition position of the supply port of the supply pipe in the coating head, and FIG. 7 is a schematic cross-sectional view illustrating a third example of a disposition position of the supply port of the supply pipe in the coating head.

In the coating head 20, as illustrated in FIG. 5, a supply port 22a of the supply pipe 22 in the coating blade 32 may be flush with the blade surface 32a of the coating blade 32, but the present invention is not limited thereto. As illustrated in FIG. 6, the supply port 22a of the supply pipe 22 may protrude from the blade surface 32a of the coating blade 32, and the supply port 22a of the supply pipe 22 illustrated in FIG. 7 is drawn inside the blade surface 32a of the coating blade 32 to be in the inside portion of the coating blade 32. The supply port 22a is to supply the organic semiconductor solution 36.

The disposition position of the supply port 22a of the supply pipe 22 is not particularly limited, and for example, in a case where the length in the X direction which is obtained by projecting the liquid reservoir 34 that is a region in which the coating head 20 and the organic semiconductor solution 36 are in contact with each other to the substrate surface 30a of the substrate 30 is divided into four at an equal interval, the supply port 22a is preferably disposed in two subdivisions in the center. In the coating head 20 illustrated in FIGS. 2 to 4, the range of projecting the liquid reservoir 34 is from the perpendicular straight line La to the corner portion 32d of the coating blade 32.

Subsequently, the method of manufacturing the organic semiconductor film is described.

Figure 8:
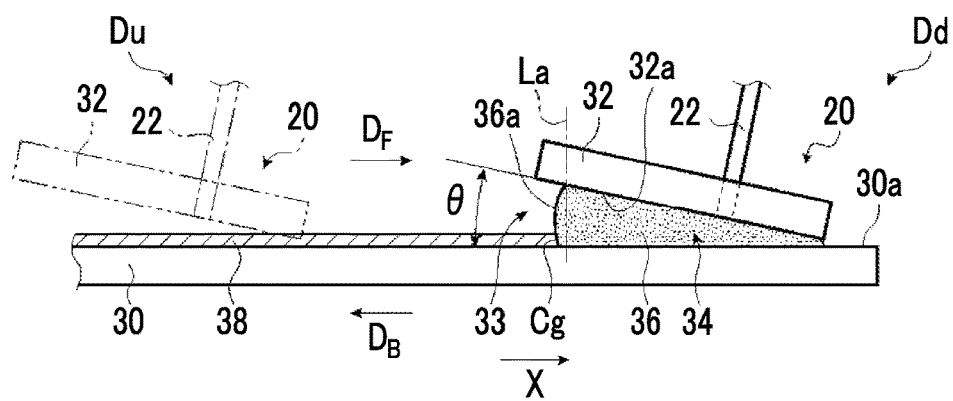
FIG. 8 is a schematic view for describing a method of manufacturing the organic semiconductor film according to the embodiment of the present invention.
Figure 9:
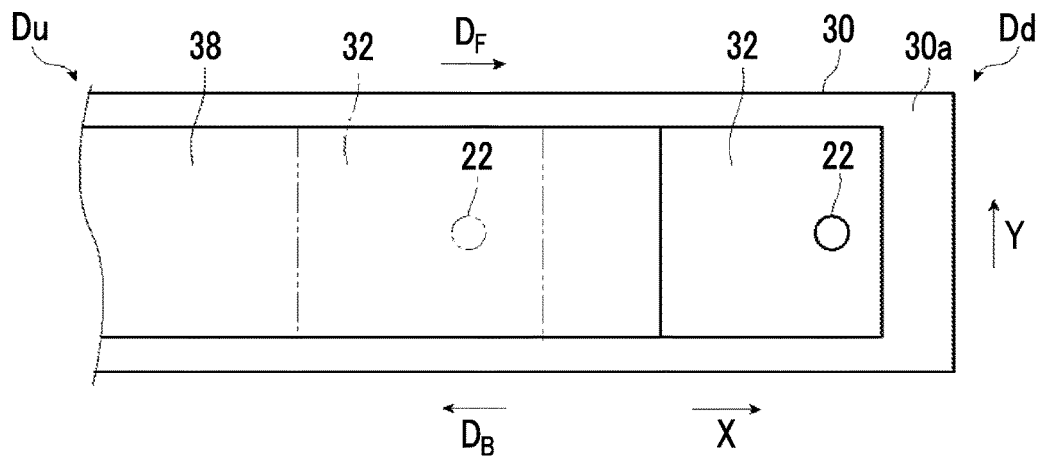
FIG. 9 is a plan view for describing the method of manufacturing the organic semiconductor film according to the embodiment of the present invention.

FIG. 8 is a schematic view illustrating a method of manufacturing the organic semiconductor film according to the embodiment of the present invention, and FIG. 9 is a plan view for describing the method of manufacturing the organic semiconductor film according to the embodiment of the present invention.

The blade surface 32a of the coating blade 32 is set to be in a state of providing the first gap $G_1$ and the second gap $G_2$ to the substrate surface 30a of the substrate 30. The first gap $G_1$ is larger than the second gap $G_2$, and thus the coating blade 32 of the flat plate is disposed such that the blade surface 32a is tilted by the tilt angle θ.

Subsequently, the organic semiconductor solution 36 is supplied from the supply portion 24 to the liquid reservoir 34 via the supply pipe 22. In this case, the temperature of the substrate 30 is set to the temperature predetermined by the temperature controller 16.

While the organic semiconductor solution 36 is supplied to a portion between the coating blade 32 of the coating head 20 and the substrate surface 30a of the substrate 30, that is, to the liquid reservoir 34, as illustrated in FIGS. 8 and 9, the blade surface 32a of the coating blade 32 is moved to the substrate surface 30a of the substrate 30 in the direction $D_F$ at a predetermined moving speed in a state in which the coating head 20, that is, the blade surface 32a of the coating blade 32 is in contact with the organic semiconductor solution 36. Accordingly, the region in which the liquid surface 36a of the organic semiconductor solution 36 of the open portion 33 is in contact with the substrate surface 30a of the substrate 30 becomes a crystal growth portion Cg (see FIG. 8) that becomes a starting point for forming the organic semiconductor film 38, and the organic semiconductor film 38 is sequentially formed in the direction $D_F$ from the crystal growth portion Cg. In this manner, while the organic semiconductor solution 36 is applied in the direction $D_F$ of moving the coating head 20, that is, the coating blade 32, in the manufacturing step, the organic semiconductor film 38 may be formed in the direction $D_F$.

The supply amount of the organic semiconductor solution 36 is appropriately determined according to the temperature and the moving speed of the substrate 30 and the size of the organic semiconductor film 38 to be formed.

With respect to the crystal growth portion Cg, a digital image including the liquid reservoir 34 and the organic semiconductor film 38 are obtained, this digital image is stored in a computer, a portion near the boundary of the liquid reservoir 34 and the organic semiconductor film 38 is visually observed based on this digital image, so as to specify the crystal growth portion Cg.

It is described that, in the step of manufacturing the organic semiconductor film 38, the coating head 20, that is, the blade surface 32a of the coating blade 32 is moved in the direction $D_F$, so as to form the organic semiconductor film 38, but the present invention is not limited thereto. The organic semiconductor film 38 may be formed in the direction $D_F$ also by moving the substrate 30 in the direction $D_B$ at a predetermined moving speed.

The direction $D_F$ is the same direction as the X direction and the direction from the first gap $G_1$ toward the second gap $G_2$. The direction $D_B$ is the reverse direction of the direction $D_F$, that is, the direction from the second gap $G_2$ toward the first gap $G_1$.

In a case where the boiling point of the solvent of the organic semiconductor solution 36 is set to Tb° C., and the temperature of the substrate surface 30a of the substrate 30 is set to Ts° C., in the step of manufacturing the organic semiconductor film 38, it is preferable that a temperature Ts of the substrate surface 30a of the substrate 30 is maintained to the temperature satisfying Tb−30° C.≤Ts≤Tb. In a case where the temperature Ts is in this temperature range, the film formation speed of the organic semiconductor film 38 may be increased, so as to increase the productivity of the organic semiconductor film 38.

It is more preferable that the temperature Ts of the substrate surface 30a of the substrate 30 in a case of forming the organic semiconductor film 38 is maintained at the temperature satisfying Tb−20° C.≤Ts≤Tb.

The moving speed of the coating head 20 in a case of forming the organic semiconductor film 38, that is, the moving speed of the blade surface 32a of the coating blade 32 is preferably 5 mm/min or faster and more preferably 10 mm/min or faster. In a case where the moving speed is 5 mm/min or faster, with respect to the organic semiconductor film 38, fast film formation speed may be obtained, so as to increase the productivity. The upper limit of the moving speed is about 100 mm/min, and in a case where the moving speed is up to about 100 mm/min, the organic semiconductor film having high crystallinity and high mobility may be obtained.

In a case where the substrate 30 is moved in a case of forming the organic semiconductor film 38, the moving speed of the substrate 30 may be set to be the same as the moving speed of the coating head 20, that is, the moving speed of the blade surface 32a of the coating blade 32.

The organic semiconductor film 38 is formed, for example, in the atmosphere and at atmospheric pressure.

In the manufacturing step of the organic semiconductor film 38, the distance between the blade surface 32a of the coating blade 32 and the substrate surface 30a of the substrate 30 is measured by the sensor 21, the sizes of the first gap $G_1$ and the second gap $G_2$ are maintained, and the blade surface 32a is moved in the first direction X.

Subsequently, an example of the thin film transistor manufactured by using the method of manufacturing the organic semiconductor film is described.

Figure 10:
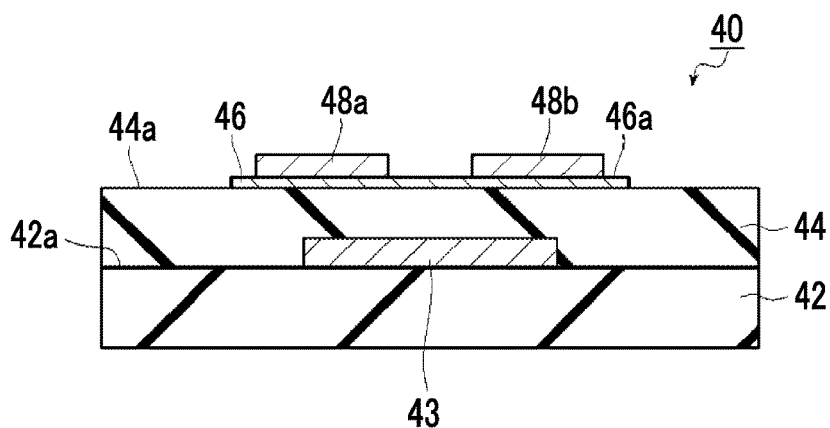
FIG. 10 is a schematic cross-sectional view illustrating an example of a thin film transistor manufactured by using the method of manufacturing the organic semiconductor film according to the embodiment of the present invention.

FIG. 10 is a schematic cross-sectional view illustrating an example of a thin film transistor manufactured by using the method of manufacturing the organic semiconductor film according to the embodiment of the present invention.

A thin film transistor 40 illustrated in FIG. 10 is a bottom gate and top contact-type transistor. In the thin film transistor 40, the gate electrode 43 is formed on a surface 42a of a substrate 42. An insulating film 44 that covers the gate electrode 43 is formed on the surface 42a of the substrate 42. An organic semiconductor layer 46 is formed on a surface 44a of the insulating film 44. The organic semiconductor layer 46 is manufactured by the method of manufacturing the organic semiconductor film. A source electrode 48a and a drain electrode 48b are formed on a surface 46a of the organic semiconductor layer 46.

In the thin film transistor 40, the organic semiconductor layer 46 is formed on the surface 44a of the insulating film 44, but, in this case, as described above, the surface 44a of the insulating film 44 corresponds to the substrate surface 30a of the substrate 30.

A transistor in which an organic semiconductor film is formed by the method of manufacturing an organic semiconductor film is not limited to the bottom gate and top contact-type thin film transistor 40 illustrated in FIG. 10. The transistor may be a bottom gate and bottom contact-type thin film transistor, may be a top gate and top contact-type thin film transistor, or may be a top gate and bottom contact-type thin film transistor.

The coating head 20 is not limited to a coating head having the coating blade 32 as illustrated in FIGS. 2 and 3.

Figure 11:
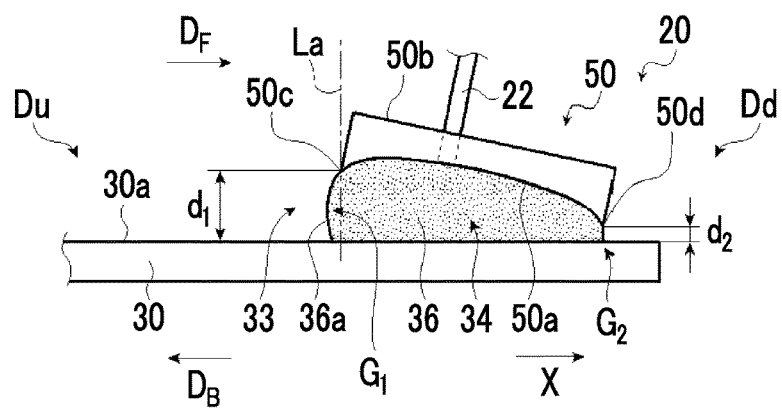
FIG. 11 is a schematic cross-sectional view illustrating a first example of the coating head used in the method of manufacturing the organic semiconductor film according to the embodiment of the present invention.
Figure 12:
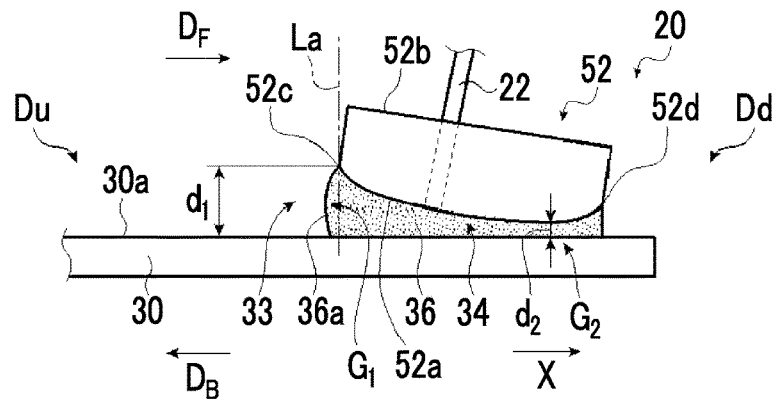
FIG. 12 is a schematic cross-sectional view illustrating a second example of the coating head.
Figure 13:
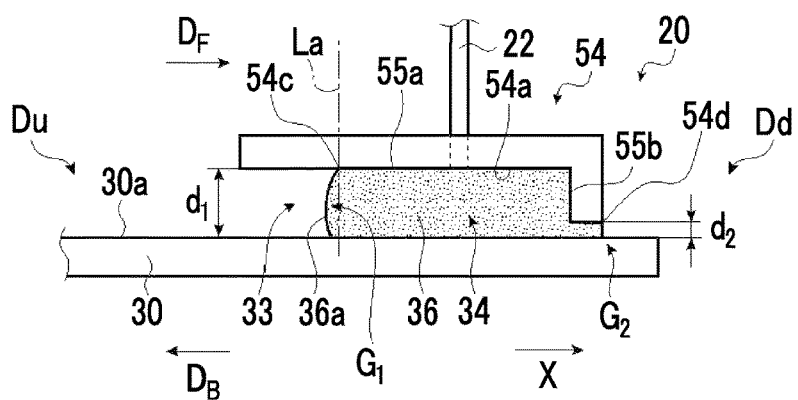
FIG. 13 is a schematic cross-sectional view illustrating a third example of the coating head.
Figure 14:
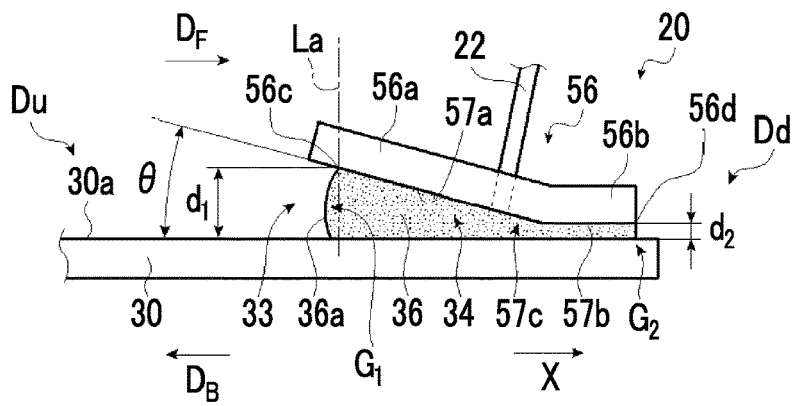
FIG. 14 is a schematic cross-sectional view according to a fourth example of the coating head.

Here, FIG. 11 is a schematic cross-sectional view illustrating a first example of the coating head used in the method of manufacturing the organic semiconductor film according to the embodiment of the present invention, FIG. 12 is a schematic cross-sectional view illustrating the second example of the coating head, FIG. 13 is a schematic cross-sectional view illustrating the third example of the coating head, and FIG. 14 is a schematic cross-sectional view according to a fourth example of the coating head.

In FIGS. 11 to 14, the same components as in the coating blade 32 illustrated in FIGS. 2 and 3 are denoted by the same reference numerals, and detailed descriptions thereof are omitted.

In the coating head 20 illustrated in FIG. 11, a coating blade 50 is different from the coating blade 32 illustrated in FIGS. 2 and 3, in that a blade surface 50a is recessed in a concave shape, and the other configuration is the same as that in the coating blade 32 illustrated in FIGS. 2 and 3.

In the coating blade 50, the size $d_1$ of the first gap $G_1$ is a length between the location 50c and the substrate surface 30a of the substrate 30 via a location 50c in which the liquid surface 36a of the organic semiconductor solution 36 in the open portion 33 of the liquid reservoir 34 is in contact with the blade surface 50a of the coating blade 50, in the straight line La perpendicular to the substrate surface 30a of the substrate 30.

The size $d_2$ of the second gap $G_2$ is a length between the substrate surface 30a of the substrate 30 and a corner portion 50d of the blade surface 50a of the coating blade 50.

The tilt angle θ of the blade surface 50a to the substrate surface 30a of the substrate 30 is an angle formed by the substrate surface 30a of the substrate 30 and a planar back surface 50b of the coating blade 50, because the blade surface 50a is recessed.

In the coating head 20 illustrated in FIG. 12, in a case where a coating blade 52 is different from the coating blade 32 illustrated in FIGS. 2 and 3, in that a blade surface 52a is swollen in a convex shape, and the other configuration is the same as that in the coating blade 32 illustrated in FIGS. 2 and 3.

In the coating blade 52, the size $d_1$ of the first gap $G_1$ is a length between a location 52c and the substrate surface 30a of the substrate 30 in the straight line La perpendicular to the substrate surface 30a of the substrate 30 through the location 52c in which the liquid surface 36a of the organic semiconductor solution 36 is in contact with the blade surface 52a of the coating blade 52 in the open portion 33 of the liquid reservoir 34.

As illustrated in FIG. 12, in a case where a position of a corner portion 52d of the blade surface 52a of the coating blade 52, that is, a solution end portion does not become a minimum gap, with respect to the size $d_2$ of the second gap $G_2$, a minimum distance between the blade surface 52a of the coating blade 52 and the substrate surface 30a of the substrate 30 is defined as the size $d_2$.

The tilt angle θ of the blade surface 52a to the substrate surface 30a of the substrate 30 is an angle formed by the substrate surface 30a of the substrate 30 and a planar back surface 52b of the coating blade 52, because the blade surface 52a is swollen.

In the coating head 20 illustrated in FIG. 13, a coating blade 54 is different from the coating blade 32 illustrated in FIGS. 2 and 3, in that a blade surface 54a of the coating blade 54 has a flat surface portion 55a parallel to the substrate surface 30a of the substrate 30 and a level difference portion 55b that is connected to one end of the flat surface portion 55a and elongates perpendicular to the substrate surface 30a, and the supply pipe 22 is provided in the flat surface portion 55a, and the other configuration is the same that in the coating blade 32 illustrated in FIGS. 2 and 3.

In the coating blade 54, the other end side of the flat surface portion 55a becomes the open portion 33.

In the coating blade 54, the size $d_1$ of the first gap $G_1$ is a length between a location 54c and the substrate surface 30a of the substrate 30 in the straight line La perpendicular to the substrate surface 30a of the substrate 30 through the location 54c in which the liquid surface 36a of the organic semiconductor solution 36 in the open portion 33 of the liquid reservoir 34 is in contact with the flat surface portion 55a of the blade surface 54a of the coating blade 54.

The size $d_2$ of the second gap $G_2$ is a length between the substrate surface 30a of the substrate 30 and a corner portion 54d of the level difference portion 55b of the blade surface 54a of the coating blade 54.

The flat surface portion 55a is parallel to the substrate surface 30a of the substrate 30, but in a case where the second gap $G_2$ is 40 μm or less, the flat surface portion 55a may be tilted with respect to the substrate surface 30a of the substrate 30.

In the coating head 20 illustrated in FIG. 14, a coating blade 56 is different from the coating blade 32 illustrated in FIGS. 2 and 3, a tilted portion 56a having a tilted surface 57a that is tilted with respect to the substrate surface 30a of the substrate 30 and a parallel portion 56b that is connected to one end of the tilted portion 56a and that has a planar surface 57b parallel to the substrate surface 30a are provided, and the supply pipe 22 is provided in the tilted portion 56a, and the other configuration is the same as that in the coating blade 32 illustrated in FIGS. 2 and 3. Like the coating blade 56 of the coating head 20 illustrated in FIG. 14, the tilted surface 57a of which a portion is tilted with respect to the substrate surface 30a of the substrate 30 and a blade surface 57c having the plane 57b parallel to the substrate surface 30a of the substrate 30 may be provided. In the coating blade 56 of the coating head 20 illustrated in FIG. 14, the tilted portion 56a is provided on the first gap $G_1$ side, and the parallel portion 56b is provided on the second gap $G_2$ side.

In the coating blade 56, the other end side of the tilted portion 56a becomes the open portion 33.

In the coating blade 56, the first gap $G_1$ is a length between a location 56c and the substrate surface 30a of the substrate 30, in the straight line La perpendicular to the substrate surface 30a of the substrate 30, via the location 56c in which the liquid surface 36a of the organic semiconductor solution 36 in the open portion 33 of the liquid reservoir 34 is in contact with the tilted surface 57a of the blade surface 57c of the coating blade 56.

The second gap $G_2$ is a length between the substrate surface 30a of the substrate 30 and a corner portion 56d of the plane 57b of the blade surface 57c of the coating blade 56.

The tilted surface 57a of the tilted portion 56a of the coating blade 56 is a tilted surface that is monotonically tilted with respect to the substrate surface 30a of the substrate 30. The tilt angle θ of the tilted surface 57a of the coating blade 56 is the same as that of the coating blade 32, and, for example, is preferably 1° to 14°. The tilt angle θ is more preferably 1° to 9° and even more preferably 4° to 9°.

The tilted surface 57a of the tilted portion 56a may not be a tilted surface that is monotonically tilted. In the coating blade 54 illustrated in FIG. 13, instead of the flat surface portion 55a, the tilted portion 56a having the tilted surface 57a illustrated in FIG. 14 may be provided.

Figure 15:
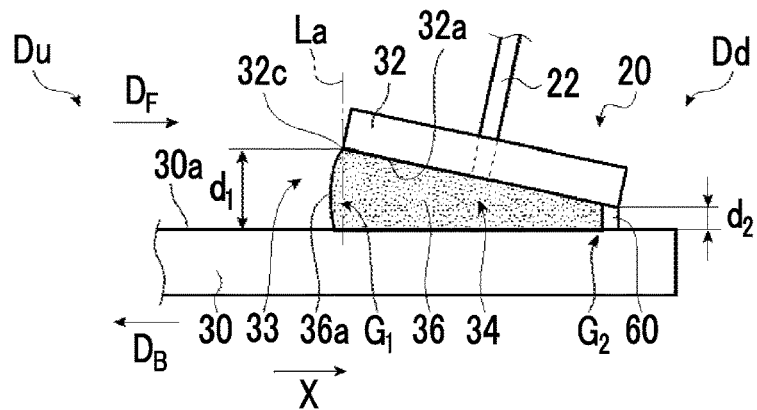
FIG. 15 is a schematic cross-sectional view illustrating a fifth example of the coating head used in the method of manufacturing the organic semiconductor film according to the embodiment of the present invention.
Figure 16:
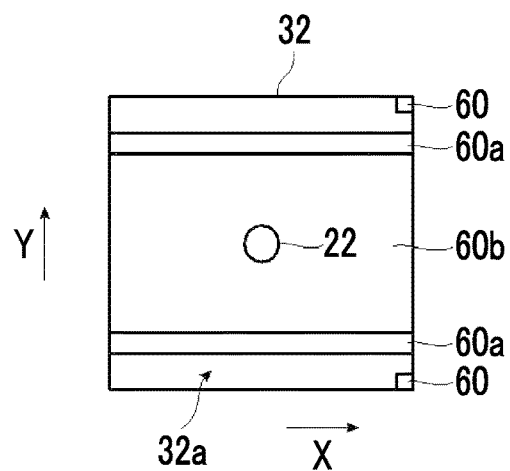
FIG. 16 is a rear view of the fifth example of the coating head.
Figure 17:
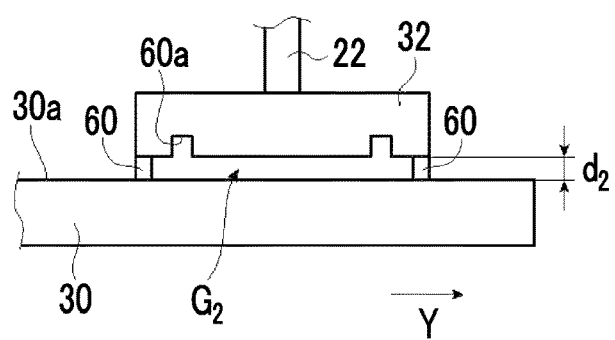
FIG. 17 is a front view of the fifth example of the coating head.
Figure 18:
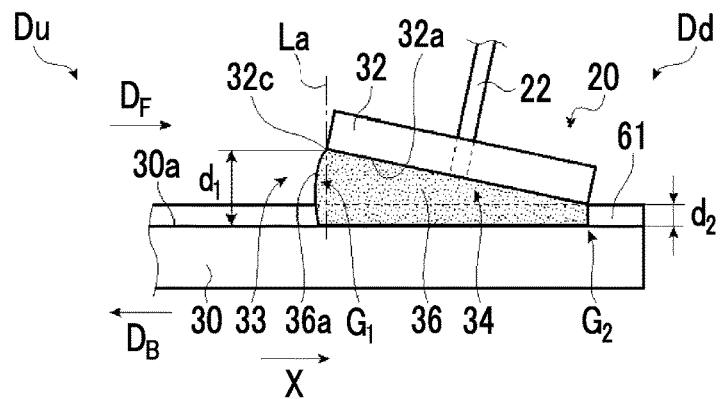
FIG. 18 is a schematic cross-sectional view illustrating a modification example of the fifth example of the coating head.

FIG. 15 is a schematic cross-sectional view illustrating a fifth example of the coating head used in the method of manufacturing the organic semiconductor film according to the embodiment of the present invention, FIG. 16 is a rear view of the fifth example of the coating head, FIG. 17 is a front view of the fifth example of the coating head, and FIG. 18 is a schematic cross-sectional view illustrating a modification example of the fifth example of the coating head.

In FIGS. 15 to 18, the same components as in the coating blade 32 illustrated in FIGS. 2 and 3 are denoted by the same reference numerals, and detailed descriptions thereof are omitted.

The coating blade 32 of the coating head 20 illustrated in FIGS. 15 to 17 is different from the coating blade 32 illustrated in FIGS. 2 and 3, in that an interval is provided in a Y direction on the blade surface 32a on the second gap $G_2$ side of the coating blade 32, two protrusions 60 that face the substrate surface 30a of the substrate 30 are provided, and two grooves 60a that elongates parallel to the X direction are provided on the blade surface 32a illustrated in FIGS. 16 and 17 with an interval in the Y direction, inside the protrusions 60, and the other configuration is the same as that in the coating blade 32 illustrated in FIGS. 2 and 3.

The protrusions 60 are provided in order to easily maintain the size $d_2$ of the second gap $G_2$ and are set to have a height that becomes the predetermined size $d_2$ of the second gap $G_2$ in a state in which the protrusions 60 are in contact with the substrate surface 30a of the substrate 30. In a case where the protrusions 60 are provided, the size $d_2$ of the second gap $G_2$ may be easily maintained. In the coating head 20 illustrated in FIGS. 15 to 17, the organic semiconductor film 38 is formed in a state in which the protrusions 60 are in contact with the substrate surface 30a of the substrate 30.

In the coating blade 32, a region 60b that is interposed between two grooves 60a in the blade surface 32a is a region for forming the organic semiconductor film 38. In a case where the two grooves 60a are provided inside of the protrusions 60, it is possible to suppress the contact of the organic semiconductor solution 36 with the protrusions 60. It is obvious that the groove 60a does not have to be provided, and the protrusions 60 are in contact with the organic semiconductor solution 36.

The number of the protrusions 60 that face the substrate surface 30a of the substrate 30 is not limited to two, and at least one protrusion 60 may be provided.

The present invention is not limited to a configuration in which the protrusions 60 are provided on the coating blade 32, and at least one protrusion 61 that faces the blade surface 32a of the coating blade 32 of the coating head 20 illustrated in FIG. 18 may be provided on the substrate surface 30a of the substrate 30 without providing the protrusions 60 on the coating blade 32, so as to maintain the size $d_2$ of the second gap $G_2$.

For example, the protrusions 61 are formed on the substrate surface 30a of the substrate 30 by using photolithography. Specifically, after a photocurable resin is formed on the substrate surface 30a of the substrate 30 by a coating method, patterning irradiation is performed on the photocurable resin coated film with light, regions to be the protrusions 61 are cured, and then the uncured resin is washed, so as to form the protrusions 61.

In addition to the photolithography, the protrusions 61 may be formed by coating a predetermined position of the substrate surface 30a of the substrate 30 with a curable resin by using an inkjet method.

Figure 19:
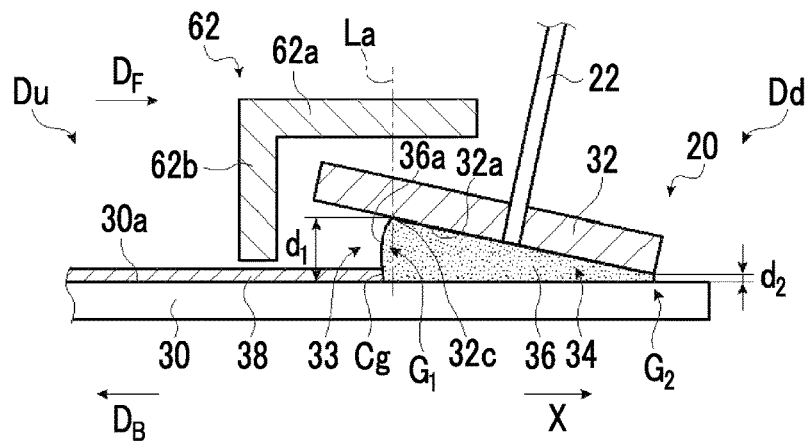
FIG. 19 is a schematic cross-sectional view illustrating a sixth example of the coating head used in the method of manufacturing the organic semiconductor film according to the embodiment of the present invention.
Figure 20:
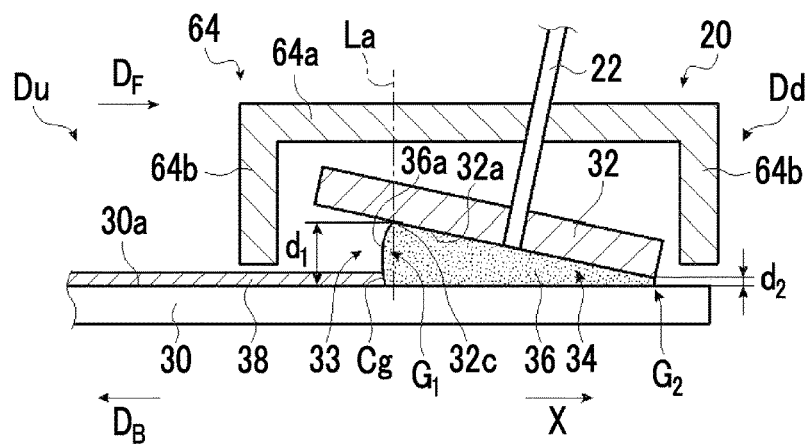
FIG. 20 is a schematic cross-sectional view illustrating a seventh example of the coating head.

FIG. 19 is a schematic cross-sectional view illustrating a sixth example of the coating head used in the method of manufacturing the organic semiconductor film according to the embodiment of the present invention, and FIG. 20 is a schematic cross-sectional view illustrating a seventh example of the coating head.

In FIGS. 19 and 20, the same components as in the coating blade 32 illustrated in FIGS. 2 and 3 are denoted by the same reference numerals, and detailed descriptions thereof are omitted.

The coating head 20 illustrated in FIG. 19 is different from the coating blade 32 illustrated in FIGS. 2 and 3, in that a cover portion 62 that surrounds the open portion 33 is provided on the first gap $G_1$ side, and the other configuration is the same as that in the coating blade 32 illustrated in FIGS. 2 and 3.

The cover portion 62 has a flat surface portion 62a parallel to the substrate surface 30a of the substrate 30 and a perpendicular portion 62b that is connected to one end portion of the flat surface portion 62a and that is perpendicular to the substrate surface 30a of the substrate 30.

In a case where the cover portion 62 that surrounds the open portion 33 is provided, the evaporation rate of the solvent of the organic semiconductor solution 36 near the crystal growth portion Cg may be suppressed, the wind that is generated according to the movement of the coating head 20 or the substrate 30 in a case where the organic semiconductor film 38 is formed does not reach the crystal growth portion Cg, the vibration of the crystal growth portion Cg may be suppressed, the vibration of the liquid reservoir 34 may be suppressed, and the organic semiconductor film 38 may be stably formed.

In a case where the cover portion 62 is provided, even in a case where the substrate temperature is increased so as to increase the productivity of the organic semiconductor film 38, the solvent vapor pressure of the organic semiconductor solution 36 is maintained, and thus the evaporation rate of the solvent may be suppressed. Accordingly, it is possible to obtain the high film quality organic semiconductor film 38 having high crystallinity and high mobility may be obtained with high productivity.

The cover portion 62 may cover at least a crystal growth portion of the organic semiconductor solution 36 between the blade surface 32a of the coating blade 32 of the coating head 20 and the substrate surface 30a of the substrate 30.

The coating head 20 illustrated in FIG. 20 is different from the coating blade 32 illustrated in FIGS. 2 and 3, in that a cover portion 64 that covers the entire coating blade 32 is provided, and the other configuration is the same as that in the coating blade 32 illustrated in FIGS. 2 and 3.

The cover portion 64 has a flat surface portion 64a that is parallel to the substrate surface 30a of the substrate 30 and a perpendicular portion 64b that is connected to both end portions of the flat surface portion 64a and that is perpendicular to the substrate surface 30a of the substrate 30.

In a case where the cover portion 64 that covers the entire coating blade 32 is provided, the evaporation rate of the solvent of the organic semiconductor solution 36 near the crystal growth portion Cg may be suppressed, the wind that is generated according to the movement of the coating head 20, that is, the coating blade 32 and the movement of the substrate 30 in a case where the organic semiconductor film 38 is formed does not reach the crystal growth portion Cg, the vibration of the crystal growth portion Cg may be suppressed, the vibration of the liquid reservoir 34 may be also suppressed, and the organic semiconductor film 38 may be stably formed.

In a case where the cover portion 64 is provided, even in a case where the substrate temperature is increased so as to increase the productivity of the organic semiconductor film 38, the solvent vapor pressure of the organic semiconductor solution 36 is maintained, and thus the evaporation rate of the solvent may be suppressed. Accordingly, it is possible to obtain the high film quality organic semiconductor film 38 having high crystallinity and high mobility may be obtained with high productivity.

In a case where the moving speed of the coating head 20, that is, the coating blade 32 is increased in order to increase the productivity of the organic semiconductor film 38, the crystal growth portion Cg of the organic semiconductor solution 36 moves together with the movement of the coating blade 32, and is influenced by the wind, it is preferable that not the coating blade 32 but the substrate 30 is moved.

Figure 21:
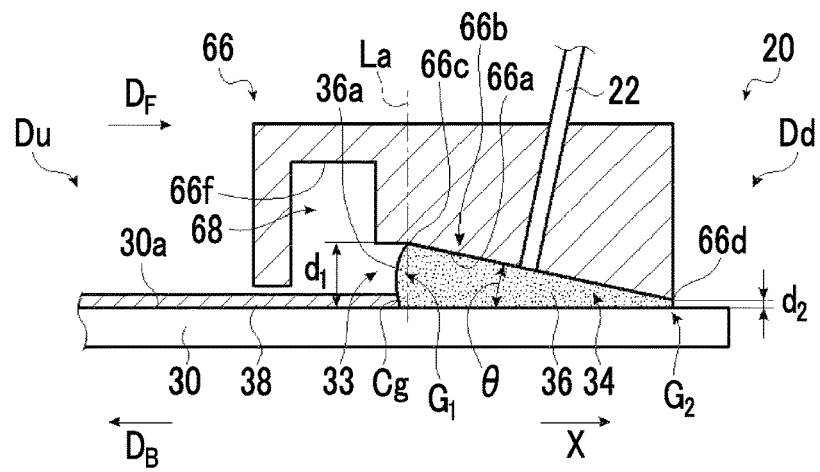
FIG. 21 is a schematic cross-sectional view illustrating an eighth example of the coating head used in the method of manufacturing the organic semiconductor film according to the embodiment of the present invention.
Figure 22:
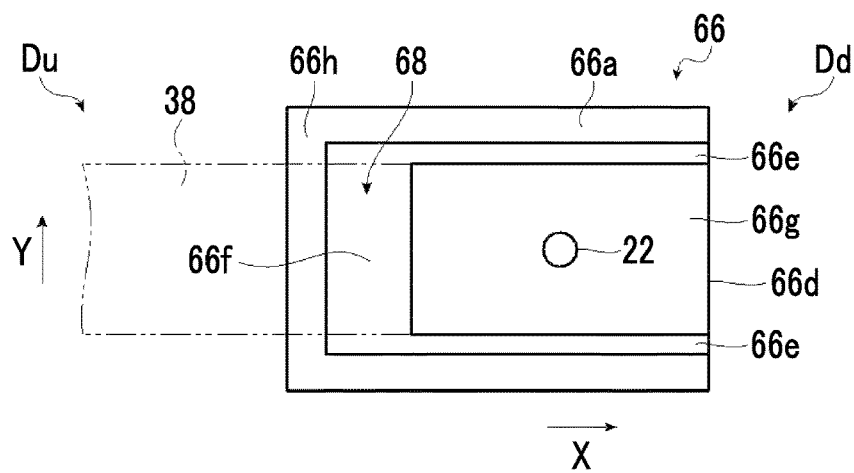
FIG. 22 is a rear view of the eighth example of the coating head.
Figure 23:
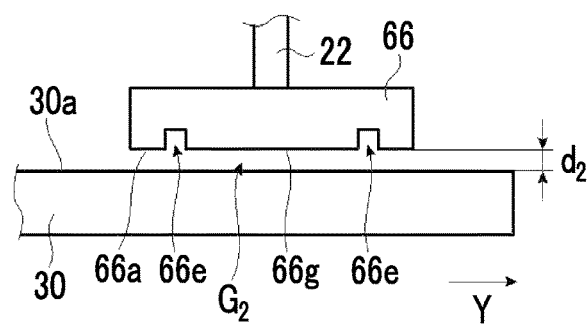
FIG. 23 is a front view of the eighth example of the coating head.

FIG. 21 is a schematic cross-sectional view illustrating an eighth example of the coating head used in the method of manufacturing the organic semiconductor film according to the embodiment of the present invention, FIG. 22 is a rear view of the eighth example of the coating head, and FIG. 23 is a front view of the eighth example of the coating head.

In FIGS. 21 to 23, the same components as in the coating blade 32 illustrated in FIGS. 2 and 3 are denoted by the same reference numerals, and detailed descriptions thereof are omitted.

The coating head 20 illustrated in FIGS. 21 to 23 is different from the coating blade 32 illustrated in FIGS. 2 and 3, in that a coating blade 66 to which a cover portion is integrated is provided, and the other configuration is the same as that in the coating blade 32 illustrated in FIGS. 2 and 3.

The coating blade 66 has a blade surface 66a that is tilted with respect to the substrate surface 30a of the substrate 30, and the supply pipe 22 that reaches the blade surface 66a is provided. The blade surface 66a of the coating blade 66 is a tilted surface that is monotonically tilted with respect to the substrate surface 30a of the substrate 30. The tilt angle θ of the blade surface 66a of the coating blade 66 is the same as the blade surface 32a of the coating blade 32, and, for example, is preferably 1° to 14°. The tilt angle θ is more preferably 1° to 9° and even more preferably 4° to 9°. The blade surface 66a of the coating blade 66 may not be a tilted surface that is monotonically tilted.

Two grooves 66e that elongates parallel to the X direction is provided on the blade surface 66a as illustrated in FIGS. 22 and 23 with an interval in the Y direction. A recessed part 66f that communicates with the open portion 33 of the first gap $G_1$ and elongates in the Y direction is formed, and the region that surrounds the recessed part 66f becomes a cover portion 68 of the organic semiconductor solution 36 as illustrated in FIGS. 21 and 22. The two grooves 66e and the recessed part 66f communicate with each other.

In the coating blade 66, a region 66g that surrounds the two grooves 66e and the recessed part 66f in the blade surface 66a is a region for forming the organic semiconductor film 38. In a case where the two grooves 66e and the recessed part 66f are provided, the spreading of the organic semiconductor solution 36 to an edge portion 66h of the blade surface 66a may be suppressed.

In a case where the cover portion 68 of the organic semiconductor solution 36 in the open portion 33 is provided to the coating blade 66 in an integrated manner, the coating blade 66 may be stably moved in a case where the organic semiconductor film 38 is formed. In a case where the cover portion is an independent body, a cover portion may be attached to the coating blade, and thus other members are required. In a case where a cover portion is attached to the coating blade, it is required to guarantee the reliability and the like, but in the case of providing the cover portion 68 in an integrated manner, the attachment of the cover portion or the guarantee of the reliability is not required.

In a case where the cover portion 68 is provided to the coating blade 66 in an integrated manner, the evaporation rate of the solvent of the organic semiconductor solution 36 near the crystal growth portion Cg (see FIG. 21) may be suppressed, the wind that is generated according to the movement of the coating blade 66 or the substrate 30 in a case where the organic semiconductor film 38 is formed does not reach the crystal growth portion Cg, the vibration of the crystal growth portion Cg may be suppressed, the vibration of the liquid reservoir 34 may be suppressed, and the organic semiconductor film 38 may be stably formed.

In a case where the cover portion 68 is provided to the coating blade 66 in an integrated manner, even in a case where the substrate temperature is increased so as to increase the productivity of the organic semiconductor film 38, the solvent vapor pressure of the organic semiconductor solution 36 is maintained, and thus the evaporation rate of the solvent may be suppressed. Accordingly, it is possible to obtain the high film quality organic semiconductor film 38 having high crystallinity and high mobility may be obtained with high productivity.

In the coating blade 66, the size $d_1$ of the first gap $G_1$ is a length between the location 66c and the substrate surface 30a of the substrate 30 via a location 66c in which the liquid surface 36a of the organic semiconductor solution 36 in the open portion 33 of the liquid reservoir 34 is in contact with the blade surface 66a of the coating blade 66, in the straight line La perpendicular to the substrate surface 30a of the substrate 30.

The size $d_2$ of the second gap $G_2$ is a length between the substrate surface 30a of the substrate 30 and a corner portion 66d of the blade surface 66a of the coating blade 66.

Figure 24:
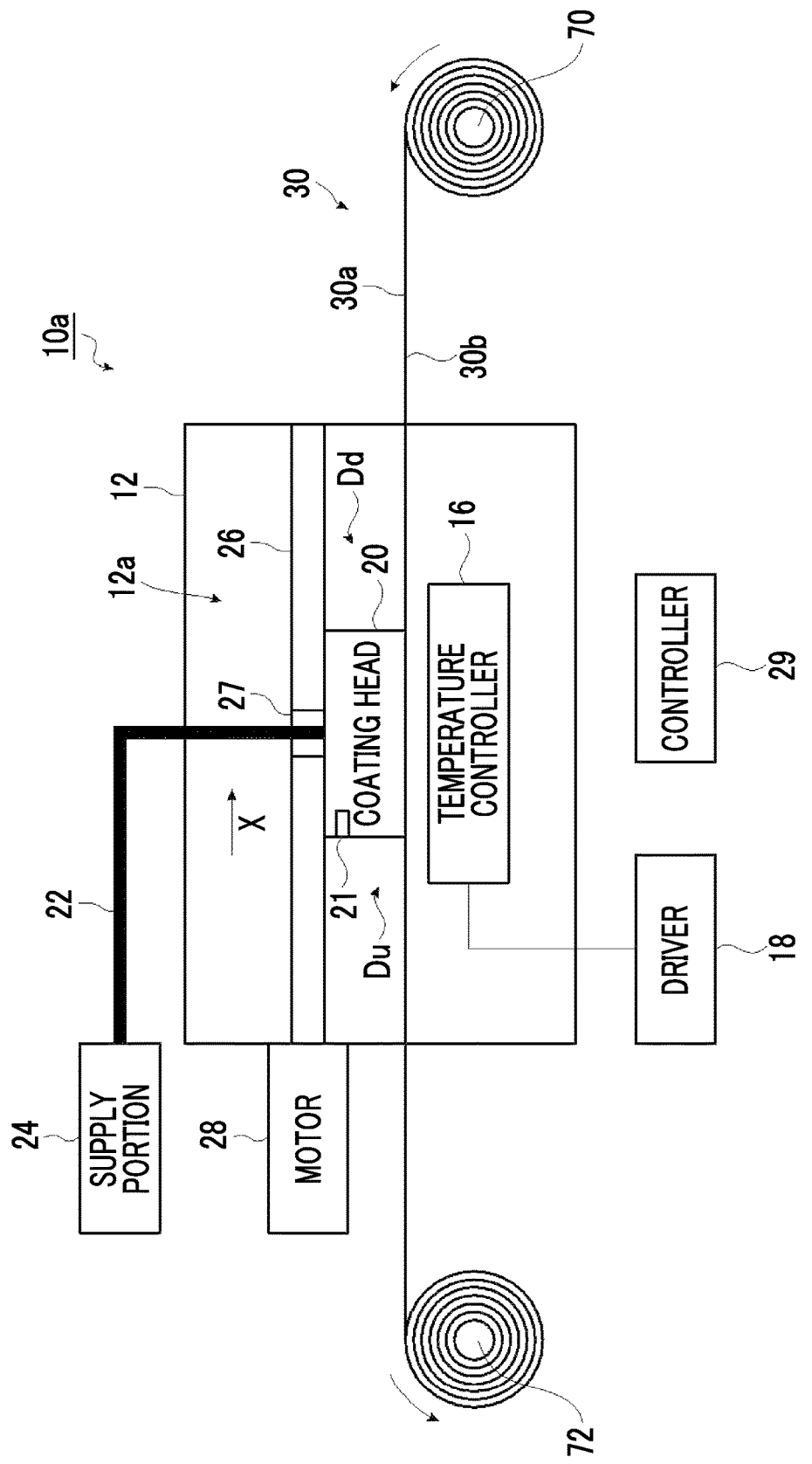
FIG. 24 is a schematic view illustrating another example of the manufacturing device used in the method of manufacturing the organic semiconductor film according to the embodiment of the present invention.

The manufacturing device 10 is a single wafer type, but the method of manufacturing the organic semiconductor film is not limited to the single wafer type and may be a roll to roll method as in a manufacturing device 10a as illustrated in FIG. 24.

With respect to the manufacturing device 10a of FIG. 24, the same components as in the manufacturing device 10 illustrated in FIG. 1 are denoted by the same reference numerals, and detailed descriptions thereof are omitted.

The manufacturing device 10a illustrated in FIG. 24 is different from the manufacturing device 10 of FIG. 1, in that the stage 14 is not provided, a transport form of the substrate 30 is stretched to an unwinding roller 70 and a winding roller 72, the coating head 20 having a coating blade is disposed on the substrate surface 30a side of the substrate 30, and the temperature controller 16 is disposed on the back surface 30b side, and the other configuration is the same as that in the manufacturing device 10 illustrated in FIG. 1.

In the manufacturing device 10a of FIG. 24, the temperature of the substrate surface 30a of the substrate 30 in the temperature controller 16 becomes a predetermined temperature, and the organic semiconductor film 38 is formed by the coating blade 32 (see FIG. 2) of the coating head 20. In a case where the organic semiconductor film 38 is formed, the coating head 20, that is, the coating blade 32 (see FIG. 2) may be moved, and the substrate 30 may be transported by being wound with the winding roller 72.

Materials of each configuration and the like are described below.

The coating blade is formed, for example, by glass, quartz glass, and stainless steel.

For example, a glass substrate or a plastic substrate is used in the substrate 30.

Examples of the plastic substrate include polyesters such as polyethylene terephthalate (PET) and polyethylene naphthalate (PEN), polyolefins such as polyethylene (PE), polypropylene (PP), polystyrene, ethylene vinyl acetate (EVA), a cycloolefin polymer (COP), and a cycloolefin copolymer (COC), a vinyl resin, polycarbonate (PC), polyamide, polyimide, an acrylic resin, and triacetyl cellulose (TAC). The plastic substrate is not folded even in a case of being bent, and is used, for example, in the case of forming by a roll to roll method.

Generally, at least an organic semiconductor (organic semiconductor compound) and a solvent are included in the organic semiconductor solution 36.

The types of the organic semiconductor are not particularly limited, and well-known organic semiconductors may be used. Specific examples thereof include pentacenes such as 6,13-bis(triisopropylsilylethynyl) pentacene (TIPS pentacene), tetramethyl pentacene, and perfluoropentacene, anthradithiophenes such as 5,11-bis(triethylsilylethynyl) anthradithiophene (TES-ADT) and 2,8-difluoro-5,11-bis(triethylsilylethynyl) anthradithiophene (diF-TES-ADT), benzothienobenzothiophenes such as 2,7-diphenyl[1]benzothieno[3,2-b][1]benzothiophene (DPh-BTBT) and benzothienobenzothiophene (Cn-BTBT), dinaphthothienothiophenes such as 3,11-didecyl-dinaphtho[2,3-d:2',3'-d']benzo[1,2-b:4,5-b']dithiophene (C10-DNBDT) and dinaphtho[2,3-b:2',3'-f]thieno[3,2-b]thiophene (Cn-DNTT), dioxaanthanthrenes such as perixanthenoxanthene, rubrenes, fullerenes such as C60 and [6,6]-phenyl-C61-butyric acid methyl ester (PCBM), phthalocyanines such as copper phthalocyanine and fluorinated copper phthalocyanine, polythiophenes such as poly(3-alkylthiophene) (P3RT), poly[5,5'-bis(3-dodecyl-2-thienyl 1)-2,2'-bithiophen] (PQT), and poly(3-hexylthiophene) (P3HT), and polythienothiophenes such as poly[2,5-bis(3-dodecylthiophene-2-yl)thieno[3,2-b]thiophene] (PBTTT).

The types of the solvent are not particularly limited, and examples thereof include an alcohol-based solvent such as methanol and ethanol; a ketone-based solvent such as acetone, methyl ethyl ketone, and methyl isobutyl ketone; an aromatic solvent such as benzene and thiophene; halogen (chlorine, bromine, and the like) substitution products (halogenated aromatic solvents) thereof; an ether-based solvent such as tetrahydrofuran and diethyl ether; an amide-based solvent such as dimethylformamide and dimethylacetamide; and a sulfonic acid-based solvent such as dimethyl sulfoxide and sulfolane.

The present invention basically has the configuration as above. In the above, the method of manufacturing an organic semiconductor film of the present invention is been described, but the present invention is not limited to the above embodiments, and it is obvious that various improvements and modifications may be performed without departing from the gist of the present invention.

Examples

Hereinafter, a method of manufacturing an organic semiconductor film according to the present invention is specifically described with reference to examples. A material, a reagent, an amount used, an amount of a material, a proportion, a treatment detail, a treatment order, and the like provided in the following examples may be suitably changed without departing from the gist of the present invention. The scope of the present invention should not be construed in a limited manner by the following specific examples.

In the present examples, the organic semiconductor layer formed with the organic semiconductor film was formed by using the method of manufacturing the organic semiconductor film so as to obtain a thin film transistor, and a thin film transistor element was evaluated.

The thin film transistor was manufactured so as to have a channel width W of 1 mm and a channel length L of 50 μm by using the bottom gate and top contact-type thin film transistor 40 illustrated in FIG. 10.

First, after a glass substrate was washed, a gate pattern was prepared by vacuum evaporation using a metal mask. Chromium (Cr) with a thickness of 10 nm was deposited as an adhesive layer, and then a gate electrode having a thickness of 40 nm was formed by using silver (Ag).

Subsequently, a polyimide insulating film having a thickness of 0.5 μm was formed on the glass substrate by spin coating and curing.

Subsequently, the glass substrate was provided on a hot plate on the stage, the temperature of the substrate surface is set to a predetermined temperature, the organic semiconductor solution 36 was applied at a predetermined moving speed (mm/min), and an organic semiconductor film was formed, so as to obtain an organic semiconductor layer. In Tables 1 and 2, temperatures of the substrate surface are presented together with substrate temperatures.

As the organic semiconductor solution 36, C10-DNBDT (3,11-didecyl-dinaphtho[2,3-d:2',3'-d']-benzo[1,2-b:4,5-b'] dithiophene) was used in the organic semiconductor, and as the solvent, chlorobenzene or o-dichlorobenzene was used. A boiling point of the chlorobenzene was 131° C., and the boiling point of the o-dichlorobenzene was 180° C.

After the coating head having the coating blade provided above the substrate was fixed at a predetermined height and at a predetermined position of the blade surface angle, an organic semiconductor solution was supplied, so as to form a liquid reservoir. The supply amount of the organic semiconductor solution was adjusted according to the moving speed and the like so that the size of the liquid reservoir did not change during coating. The angle of the blade surface of the coating blade of the coating head was set to the coated surface angle in Tables 1 and 2 below.

Subsequently, gold (Au) films having a thickness of 70 nm were formed as source and drain electrodes on the organic semiconductor layer by a vacuum evaporation method using a metal mask.

As the coating blade of the coating head, Type A illustrated in FIGS. 2 to 4, Type B illustrated in FIG. 13, Type C illustrated in FIG. 19, Type D illustrated in FIG. 20, and Type E illustrated in FIGS. 21 to 23.

The size of the coating blade of the coating head did not depend on the types, the length of the coating blade was set to 2 cm, and the width of the coating blade was set to 1.5 cm. The formed organic semiconductor film had a width of 1.5 cm and the length of 10 cm.

The thin film transistor was manufactured in the center of the organic semiconductor film at the position of 0.75 cm in the width direction and 5 cm in the length direction.

With respect to the characteristics of the thin film transistor element, the saturation mobility of the manufactured thin film transistor was measured by using a semiconductor parameter analyzer (4156C manufactured by Agilent). The characteristics of the thin film transistor element are presented as "TFT characteristics" in Tables 1 and 2 below.

Based on the measured saturation mobility μ, the characteristics of the thin film transistor element were evaluated with the following evaluation standard.

a saturation mobility μ was 1.0 cm²/Vs or more
b saturation mobility μ was 0.5 cm²/Vs or more and less than 1.0 cm²/Vs
c saturation mobility μ was 0.01 cm²/Vs or more and less than 0.5 cm²/Vs
d saturation mobility μ was less than 0.01 cm²/Vs The position of the supply pipe 22 was changed, so as to change the position of the supply port in the coating blade 32.

Figure 25:
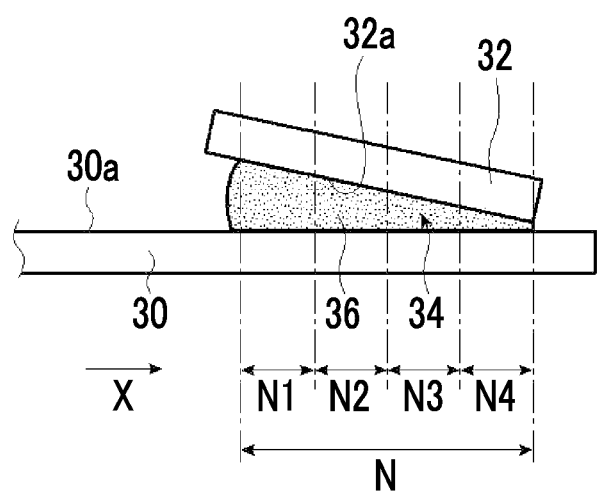
FIG. 25 is a schematic view for describing a position of a supply port in a coating blade.

FIG. 25 is a schematic view for describing a position of a supply port in a coating blade.

As illustrated in FIG. 25, the projection length of the liquid reservoir 34 which is a region in which the blade surface 32a of the coating blade 32 and the organic semiconductor solution 36 are in contact with each other, which projects to the substrate surface 30a of the substrate 30 in the X direction is set to N, and the projection length N is divided into four subdivisions of N1 to N4 at the equal interval. The projection length N was set to 20 mm, and each subdivision of N1 to N4 was 5 mm FIG. 25 illustrates a coating blade of Type A. However, with respect to the position of the supply port, 20 mm of the projection lengths N of the coating blades of the other Types B to E each were divided into four subdivisions of N1 to N4 at the equal interval.

In the section of the coated surface angle of Tables 1 and 2 below, "-" refers to parallel.

TABLE 1

| | Organic semiconductor | Type of Solvent | Concentration of solvent (mass %) | Type of blade shape | First gap (μm) | Second gap (μm) | Coated surface angle (°) | Substrate temperature (° C.) | Movement speed (mm/min) | Position of supply port | TFT Characteristics |
|---|---|---|---|---|---|---|---|---|---|---|---|
| Example 1 | C10-DNBDT | Chlorobenzene | 0.1 | A | 1010 | 10 | 2.9 | 120 | 10 | N2 | a |
| Example 2 | C10-DNBDT | Chlorobenzene | 0.1 | A | 1020 | 20 | 2.9 | 120 | 10 | N2 | a |
| Example 3 | C10-DNBDT | Chlorobenzene | 0.1 | A | 1040 | 40 | 2.9 | 120 | 10 | N2 | b |
| Example 4 | C10-DNBDT | Chlorobenzene | 0.1 | A | 520 | 20 | 1.4 | 120 | 10 | N2 | b |
| Example 5 | C10-DNBDT | Chlorobenzene | 0.1 | A | 1520 | 20 | 4.3 | 120 | 10 | N2 | a |
| Example 6 | C10-DNBDT | Chlorobenzene | 0.1 | A | 3020 | 20 | 8.5 | 120 | 10 | N2 | a |
| Example 7 | C10-DNBDT | Chlorobenzene | 0.1 | A | 5020 | 20 | 14.0 | 120 | 10 | N2 | c |
| Example 8 | C10-DNBDT | Chlorobenzene | 0.1 | B | 1010 | 10 | — | 120 | 10 | N2 | a |
| Example 9 | C10-DNBDT | Chlorobenzene | 0.1 | B | 1020 | 20 | — | 120 | 10 | N2 | a |
| Example 10 | C10-DNBDT | Chlorobenzene | 0.1 | B | 1040 | 40 | — | 120 | 10 | N2 | b |
| Example 11 | C10-DNBDT | Chlorobenzene | 0.1 | B | 520 | 20 | — | 120 | 10 | N2 | b |
| Example 12 | C10-DNBDT | Chlorobenzene | 0.1 | B | 1520 | 20 | — | 120 | 10 | N2 | a |
| Example 13 | C10-DNBDT | Chlorobenzene | 0.1 | B | 3020 | 20 | — | 120 | 10 | N2 | a |
| Example 14 | C10-DNBDT | Chlorobenzene | 0.1 | B | 5020 | 20 | — | 120 | 10 | N2 | c |
| Example 15 | C10-DNBDT | Chlorobenzene | 0.1 | A | 1020 | 20 | 2.9 | 100 | 10 | N2 | c |
| Example 16 | C10-DNBDT | Chlorobenzene | 0.1 | A | 1020 | 20 | 2.9 | 110 | 10 | N2 | b |
| Example 17 | C10-DNBDT | Chlorobenzene | 0.1 | A | 1020 | 20 | 2.9 | 120 | 10 | N2 | a |
| Example 18 | C10-DNBDT | Chlorobenzene | 0.1 | A | 1020 | 20 | 2.9 | 130 | 10 | N2 | a |
| Example 19 | C10-DNBDT | o-Dichlorobenzene | 0.1 | A | 1020 | 20 | 2.9 | 140 | 10 | N2 | c |
| Example 20 | C10-DNBDT | o-Dichlorobenzene | 0.1 | A | 1020 | 20 | 2.9 | 150 | 10 | N2 | b |
| Example 21 | C10-DNBDT | o-Dichlorobenzene | 0.1 | A | 1020 | 20 | 2.9 | 160 | 10 | N2 | a |
| Example 22 | C10-DNBDT | o-Dichlorobenzene | 0.1 | A | 1020 | 20 | 2.9 | 170 | 10 | N2 | a |
| Example 23 | C10-DNBDT | Chlorobenzene | 0.075 | A | 1020 | 20 | 2.9 | 120 | 5 | N2 | a |
| Example 24 | C10-DNBDT | Chlorobenzene | 0.2 | A | 1020 | 20 | 2.9 | 120 | 30 | N2 | b |
| Example 25 | C10-DNBDT | o-Dichlorobenzene | 0.1 | A | 1020 | 20 | 2.9 | 160 | 30 | N2 | a |
| Example 26 | C10-DNBDT | o-Dichlorobenzene | 0.2 | A | 1020 | 20 | 2.9 | 160 | 50 | N2 | b |
| Example 27 | C10-DNBDT | o-Dichlorobenzene | 0.2 | A | 1520 | 20 | 4.3 | 160 | 100 | N2 | c |

TABLE 2

| | Organic semiconductor | Type of Solvent | Concentration of solvent (mass %) | Type of blade shape | First gap (μm) | Second gap (μm) | Coated surface angle (°) | Substrate temperature (° C.) | Movement speed (mm/min) | Position of supply port | TFT Characteristics |
|---|---|---|---|---|---|---|---|---|---|---|---|
| Example 28 | C10-DNBDT | Chlorobenzene | 0.1 | A | 1020 | 20 | 2.9 | 120 | 10 | N1 | b |
| Example 29 | C10-DNBDT | Chlorobenzene | 0.1 | A | 1020 | 20 | 2.9 | 120 | 10 | N3 | a |
| Example 30 | G10-DNBDT | Chlorobenzene | 0.1 | A | 1020 | 20 | 2.9 | 120 | 10 | N4 | c |
| Example 31 | C10-DNBDT | Chlorobenzene | 0.15 | A | 1020 | 20 | 2.9 | 120 | 20 | N2 | b |
| Example 32 | C10-DNBDT | Chlorobenzene | 0.15 | C | 1020 | 20 | 2.9 | 120 | 20 | N2 | a |
| Example 33 | C10-DNBDT | Chlorobenzene | 0.15 | D | 1020 | 20 | 2.9 | 120 | 20 | N2 | a |
| Example 34 | C10-DNBDT | Chlorobenzene | 0.15 | E | 1020 | 20 | 2.9 | 120 | 20 | N2 | a |
| Example 35 | C10-DNBDT | Chlorobenzene | 0.2 | C | 1020 | 20 | 2.9 | 120 | 30 | N2 | b |
| Example 36 | C10-DNBDT | Chlorobenzene | 0.2 | D | 1020 | 20 | 2.9 | 120 | 30 | N2 | a |
| Example 37 | C10-DNBDT | Chlorobenzene | 0.2 | E | 1020 | 20 | 2.9 | 120 | 30 | N2 | a |
| Comparative Example 1 | C10-DNBDT | Chlorobenzene | 0.1 | A | 1060 | 60 | 2.9 | 120 | 10 | N2 | d |
| Comparative Example 2 | C10-DNBDT | Chlorobenzene | 0.1 | A | 20 | 20 | — | 120 | 10 | N2 | d |
| Comparative Example 3 | C10-DNBDT | Chlorobenzene | 0.1 | A | 20 | 1020 | 2.9 | 120 | 10 | N2 | d |
| Comparative Example 4 | G10-DNBDT | Chlorobenzene | 0.1 | B | 1060 | 60 | — | 120 | 10 | N2 | d |

TABLE 2-continued

| | Organic semiconductor | Type of Solvent | Concentration of solvent (mass %) | Type of blade shape | First gap (μm) | Second gap (μm) | Coated surface angle (°) | Substrate temperature (° C.) | Movement speed (mm/min) | Position of supply port | TFT Characteristics |
|---|---|---|---|---|---|---|---|---|---|---|---|
| Comparative Example 5 | C10-DNBDT | Chlorobenzene | 0.1 | B | 20 | 20 | — | 120 | 10 | N2 | d |
| Comparative Example 6 | G10-DNBDT | Chlorobenzene | 0.1 | B | 20 | 1020 | — | 120 | 10 | N2 | d |
| Comparative Example 7 | C10-DNBDT | Chlorobenzene | 0.1 | C | 1060 | 60 | 2.9 | 120 | 10 | N2 | d |
| Comparative Example 8 | C10-DNBDT | Chlorobenzene | 0.1 | C | 20 | 20 | — | 120 | 10 | N2 | d |
| Comparative Example 9 | C10-DNBDT | Chlorobenzene | 0.1 | C | 20 | 1020 | 2.9 | 120 | 10 | N2 | d |
| Comparative Example 10 | C10-DNBDT | Chlorobenzene | 0.1 | D | 1060 | 60 | 2.9 | 120 | 10 | N2 | d |
| Comparative Example 11 | C10-DNBDT | Chlorobenzene | 0.1 | D | 20 | 20 | — | 120 | 10 | N2 | d |
| Comparative Example 12 | C10-DNBDT | Chlorobenzene | 0.1 | D | 20 | 1020 | 2.9 | 120 | 10 | N2 | d |
| Comparative Example 13 | C10-DNBDT | Chlorobenzene | 0.1 | E | 1060 | 60 | 2.9 | 120 | 10 | N2 | d |
| Comparative Example 14 | C10-DNBDT | Chlorobenzene | 0.1 | E | 20 | 20 | — | 120 | 10 | N2 | d |
| Comparative Example 15 | C10-DNBDT | Chlorobenzene | 0.1 | E | 20 | 1020 | 2.9 | 120 | 10 | N2 | d |

As presented in Tables 1 and 2, in Examples 1 to 37, the characteristics of the thin film transistor elements were satisfactory. Accordingly, in the method of manufacturing the organic semiconductor film of the present invention, it is obvious that the high quality organic semiconductor film having high crystallinity and high mobility was able to be manufactured with high productivity.

As in Examples 1 to 3, in a case where the coating blade is Type A and the length of the second gap was 40 μm or less, it was possible to obtain the satisfactory characteristics of the thin film transistor element. In Examples 1 and 2, in which the length of the second gap was 20 μm or less, it was possible to obtain more satisfactory characteristics of the thin film transistor element.

As in Examples 4 to 7, in a case where the coating blade was Type A, and the tilt angle was 1° to 14°, it was possible to obtain satisfactory characteristics of the thin film transistor element. As in Examples 5 and 6, in a case where the tilt angle was 4° to 9°, it was possible to obtain more satisfactory characteristics of the thin film transistor element.

As in Example 8 to 10, in a case where the coating blade was Type B and the second gap was 40 μm or less, it was possible to obtain the satisfactory characteristics of the thin film transistor element. In Examples 8 and 9 in which the second gaps were 20 μm or less, it was possible to obtain more satisfactory characteristics of the thin film transistor element.

As in Examples 11 to 14, in a case where the coating blade was Type B, and the length of the first gap was 5 mm or less, it was possible to obtain satisfactory characteristics of the thin film transistor element. As in Examples 12 and 13, in a case where the length of the first gap was 1.5 mm to 3 mm, it was possible to obtain more satisfactory characteristics of the thin film transistor element.

As in Examples 15 to 18, in a case where the coating blade was Type A, chlorobenzene was used as the solvent, and the substrate temperature was 100° C. to 130° C., the substrate temperature satisfied the boiling point (131° C.)-30° C. of chlorobenzene or higher and the boiling point of the solvent or lower, and thus it was possible to obtain satisfactory characteristics of the thin film transistor element. In Examples 17 and 18 in which the substrate temperature was close to the boiling point of the solvent, and satisfied the boiling point (131° C.)-20° C. of chlorobenzene or higher and the boiling point of the solvent or lower, it was possible to obtain more satisfactory characteristics of the thin film transistor element.

As in Examples 19 to 22, in a case where the coating blade was Type A, o-dichlorobenzene was used in the solvent, and the substrate temperature was 140° C. to 170° C., boiling point (180° C.)-30° C. of o-dichlorobenzene or higher and the boiling point of the solvent or lower are satisfied, and thus it was possible to obtain satisfactory characteristics of the thin film transistor element. In Examples 21 and 22 in which the substrate temperature is close to the boiling point of the solvent and the boiling point (180° C.)-20° C. of o-dichlorobenzene or higher and the boiling point of the solvent or lower are satisfied, it was possible to obtain more satisfactory characteristics of the thin film transistor element.

As in Examples 23 and 24, in a case where the coating blade was Type A, chlorobenzene was used in the solvent, and the moving speed was 30 mm/min or less, it was possible to obtain satisfactory characteristics of the thin film transistor element. In Example 23 in which the moving speed was 5 mm/min, it was possible to obtain more satisfactory characteristics of the thin film transistor element.

As in Examples 25 to 27, in a case where the coating blade was Type A, o-dichlorobenzene was used in the solvent, and the moving speed was 100 mm/min or slower, it was possible to obtain satisfactory characteristics of the thin film transistor element. In a case where the moving speed became slower, the characteristics of the thin film transistor element became better, and thus it was possible to obtain more satisfactory characteristics of the thin film transistor element in Example 25 of 30 mm/min.

As in Examples 28 to 30, it was possible to obtain satisfactory characteristics of the thin film transistor element regardless of supply port positions. In Example 29 in which the supply port position was in the center of the coating blade, it was possible to obtain more satisfactory characteristics of the thin film transistor element.

Among Examples 31 to 34, in Examples 32 to 34 having cover portions, it was possible to obtain more satisfactory characteristics of the thin film transistor element.

As in Examples 35 to 37, in a case where the cover portions were provided, in Examples 36 and 37 having cover portions with large covering ranges, it was possible to obtain more satisfactory characteristics of the thin film transistor element even in a case where the moving speed was 30 mm/min.

As presented in Table 2, in Comparative Example 1, the coating blade was Type A, and the second gap was larger than 40 μm, saturation mobility was small, and thus the characteristics of the thin film transistor element were bad.

In Comparative Example 2, the coating blade was Type A, the coating blade was parallel, the saturation mobility was small, and thus characteristics of the thin film transistor element were bad.

In Comparative Example 3, the coating blade was Type A, the second gap was larger than the first gap, the organic semiconductor film was formed on the side with a smaller gap, the saturation mobility was small, and characteristics of the thin film transistor element were bad.

In Comparative Example 4, the coating blade was Type B, the second gap was larger than 40 μm, the saturation mobility was small, and thus characteristics of the thin film transistor element were bad.

In Comparative Example 5, the coating blade was Type B, the coating blade was parallel, the saturation mobility was small, and thus characteristics of the thin film transistor element were bad.

In Comparative Example 6, the coating blade was Type B, the second gap was larger than the first gap, the organic semiconductor film was formed on the side with a smaller gap, the saturation mobility was small, and thus characteristics of the thin film transistor element were bad.

In Comparative Example 7, the coating blade was Type C, the second gap was larger than 40 μm, the saturation mobility was small, and thus characteristics of the thin film transistor element were bad.

In Comparative Example 8, the coating blade was Type C, the coating blade was parallel, the saturation mobility was small, and thus characteristics of the thin film transistor element were bad.

In Comparative Example 9, the coating blade was Type C, the second gap was larger than the first gap, the organic semiconductor film was formed on the side with a smaller gap, the saturation mobility was small, and thus characteristics of the thin film transistor element were bad.

In Comparative Example 10, the coating blade was Type D, the second gap was longer than 40 μm, the saturation mobility was small, and thus characteristics of the thin film transistor element were bad.

In Comparative Example 11, the coating blade was Type D, the coating blade was parallel, the saturation mobility was small, and thus characteristics of the thin film transistor element were bad.

In Comparative Example 12, the coating blade was Type D, the second gap was larger than the first gap, the organic semiconductor film was formed on the side with a smaller gap, the saturation mobility was small, and thus characteristics of the thin film transistor element were bad.

In Comparative Example 13, the coating blade was Type E, the second gap was larger than 40 μm, the saturation mobility was small, and thus characteristics of the thin film transistor element were bad.

In Comparative Example 14, the coating blade was Type E, the coating blade was parallel, the saturation mobility was small, and thus characteristics of the thin film transistor element were bad.

In Comparative Example 15, the coating blade was Type E, the second gap was larger than the first gap, the organic semiconductor film was formed on the side with a smaller gap, the saturation mobility was small, and thus characteristics of the thin film transistor element were bad.

EXPLANATION OF REFERENCES 10, 10a: manufacturing device
12: casing
12a: inside portion
14: stage
16: temperature controller
18: driver
20: coating head
21: sensor
22: supply pipe
22a: supply port
24: supply portion
26: guide rail
27: carriage
28: motor
29: controller
30, 42: substrate
30a: substrate surface
30b, 50b, 52b: back surface
32, 50, 52, 54, 56, 66: coating blade
32a, 50a, 52a, 54a, 57c, 66a: blade surface
32c, 50c, 52c, 54c, 56c, 66c: location
32d, 50d, 52d, 54d, 56d, 66d: corner portion
33: open portion
34: liquid reservoir
36: organic semiconductor solution
36a: liquid surface
38: organic semiconductor film
40: thin film transistor
42a, 44a, 46a: surface
43: gate electrode
44: insulating film
46: organic semiconductor layer
48a: source electrode
48b: drain electrode
55a, 62a, 64a: flat surface portion
55b: level difference portion
56a: tilted portion
56b: parallel portion
57a: tilted surface
57b: plane
60, 61: protrusion
60a, 66e: groove
60b, 66g: region
62, 64, 68: cover portion
62b, 64b: perpendicular portion
66f: recessed part
66h: edge portion
70: unwinding roller
72: winding roller
Cg: crystal growth portion
$D_B$: direction
$D_F$: direction
Dd: downstream side
Du: upstream side
$G_1$: first gap G₂: second gap
L: channel length
W: channel width
X: first direction
Y: second direction
θ: tilt angle

What is claimed is:

1. A method of manufacturing an organic semiconductor film, comprising:
   a manufacturing step of moving a blade surface of a coating blade disposed to be spaced so as to face a substrate surface of a substrate in a first direction parallel to the substrate surface in a manner of being in contact with an organic semiconductor solution, while supplying the organic semiconductor solution to a portion between the blade surface and the substrate surface, so as to form an organic semiconductor film in the first direction,
   wherein the coating blade is disposed so as to have a first gap and a second gap having different separation gap sizes with respect to the substrate surface in a region in which the blade surface and the organic semiconductor solution are in contact with each other, such that the first gap is provided on an upstream side of the first direction and a second gap having a smaller gap size compared with the first gap is provided on a downstream side,
   a size of the second gap is a minimum distance between the substrate surface and the blade surface and is 40 μm or less, and
   in a case where a boiling point of a solvent of the organic semiconductor solution is set to Tb° C. and a temperature of the substrate surface is set to Ts° C., in the manufacturing step, the temperature Ts is maintained at a temperature satisfying Tb−30° C.≤Ts≤Tb.

2. The method of manufacturing an organic semiconductor film according to claim 1,
   wherein the second gap is in an end portion on the first direction side of the region in which the blade surface and the organic semiconductor solution are in contact with each other.

3. The method of manufacturing an organic semiconductor film according to claim 1,
   wherein a size of the first gap is 0.5 mm to 5 mm.

4. The method of manufacturing an organic semiconductor film according to claim 1,
   wherein the first gap is in an end portion on an opposite side to the first direction of the region in which the blade surface and the organic semiconductor solution are in contact with each other.

5. The method of manufacturing an organic semiconductor film according to claim 1,
   wherein the blade surface has a tilted surface that is tilted with respect to the substrate surface by 1° to 14°.

6. The method of manufacturing an organic semiconductor film according to claim 1,
   wherein the blade surface has a tilted surface that is tilted with respect to the substrate surface and a planar surface parallel to the substrate surface, the tilted surface is provided on the first gap side, and the plane is provided on the second gap side.

7. The method of manufacturing an organic semiconductor film according to claim 1,
   wherein the blade surface has a tilted surface that is monotonically tilted with respect to the substrate surface.

8. The method of manufacturing an organic semiconductor film according to claim 1,
   wherein the blade surface has a level difference portion to the substrate surface.

9. The method of manufacturing an organic semiconductor film according to claim 1,
   wherein a supply port for supplying the organic semiconductor solution is disposed in two subdivisions in the middle among subdivisions obtained by dividing a length in the first direction formed by projecting the region in which the blade surface and the organic semiconductor solution are in contact with each other to the substrate surface into four at an equal interval.

10. The method of manufacturing an organic semiconductor film according to claim 1,
    wherein, the temperature Ts is maintained at a temperature satisfying Tb−20° C.≤Ts≤Tb.

11. The method of manufacturing an organic semiconductor film according to claim 1,
    wherein, in the manufacturing step, a moving speed of the blade surface is 5 mm/min or faster.

12. The method of manufacturing an organic semiconductor film according to claim 1,
    wherein, in the manufacturing step, a moving speed of the blade surface is 10 mm/min or faster.

13. The method of manufacturing an organic semiconductor film according to claim 1,
    wherein the blade surface has at least one protrusion that faces the substrate surface, and
    in the manufacturing step, the protrusion is in contact with the substrate surface, and the blade surface is moved in the first direction.

14. The method of manufacturing an organic semiconductor film according to claim 2,
    wherein the blade surface has at least one protrusion that faces the substrate surface, and
    in the manufacturing step, the protrusion is in contact with the substrate surface, and the blade surface is moved in the first direction.

15. The method of manufacturing an organic semiconductor film according to claim 1,
    wherein at least one protrusion that faces the blade surface is provided on the substrate surface, and
    in the manufacturing step, the protrusion is in contact with the blade surface, and the blade surface is moved in the first direction.

16. The method of manufacturing an organic semiconductor film according to claim 2,
    wherein at least one protrusion that faces the blade surface is provided on the substrate surface, and
    in the manufacturing step, the protrusion is in contact with the blade surface, and the blade surface is moved in the first direction.

17. The method of manufacturing an organic semiconductor film according to claim 1,
    wherein, in the manufacturing step, a distance between the blade surface and the substrate surface is measured by an optical measuring method, sizes of the first gap and the second gap are maintained, and the blade surface is moved in the first direction.

18. The method of manufacturing an organic semiconductor film according to claim 1,
    wherein a cover portion that covers at least a crystal growth portion of the organic semiconductor solution between the blade surface and the substrate surface is provided.

* * * * *